(12) United States Patent
Miyazawa et al.

(10) Patent No.: US 11,004,819 B2
(45) Date of Patent: May 11, 2021

(54) PREVENTION OF BRIDGING BETWEEN SOLDER JOINTS

(71) Applicant: INTERNATIONAL BUSINESS MACHINES CORPORATION, Armonk, NY (US)

(72) Inventors: Risa Miyazawa, Kanagawa (JP); Takahito Watanabe, Kanagawa (JP); Hiroyuki Mori, Shiga-ken (JP); Keishi Okamoto, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/585,337

(22) Filed: Sep. 27, 2019

(65) Prior Publication Data

US 2021/0098404 A1    Apr. 1, 2021

(51) Int. Cl.
*H01L 21/00* (2006.01)
*H01L 23/00* (2006.01)
(Continued)

(52) U.S. Cl.
CPC .......... *H01L 24/16* (2013.01); *H01L 21/4853* (2013.01); *H01L 21/4864* (2013.01); *H01L 21/563* (2013.01); *H01L 23/3185* (2013.01); *H01L 23/5381* (2013.01); *H01L 23/5386* (2013.01); *H01L 24/81* (2013.01); *H01L 2224/16227* (2013.01); *H01L 2224/81012* (2013.01); *H01L 2224/81013* (2013.01); *H01L 2224/81815* (2013.01); *H01L 2924/3841* (2013.01)

(58) Field of Classification Search
CPC ................ H01L 24/16; H01L 24/81; H01L 2224/81012
See application file for complete search history.

(56) References Cited

U.S. PATENT DOCUMENTS

| 5,241,456 A | 8/1993 | Marcinkiewicz et al. |
| 6,063,481 A * | 5/2000 | Arrington .............. H05K 3/184 |
| | | 174/256 |

(Continued)

FOREIGN PATENT DOCUMENTS

| CN | 101246933 A | 8/2008 |
| CN | 101409267 A | 4/2009 |

(Continued)

OTHER PUBLICATIONS

IP.com machine translation of JP2012-209418.*

(Continued)

*Primary Examiner* — Laura M Menz
(74) *Attorney, Agent, or Firm* — Tutunjian & Bitetto, P.C.; Randall Bluestone

(57) ABSTRACT

A method of fabricating a connection structure is disclosed. The method includes providing a substrate that has a top surface and includes a set of pads for soldering, each of which has a pad surface exposed from the top surface of the substrate. The method also includes applying a surface treatment to a part of the top surface of the substrate close to the pads and the pad surface of each pad so as to make at least the part of the top surface and the pad surfaces of the pads rougher.

14 Claims, 13 Drawing Sheets

(51) Int. Cl.
  *H01L 21/48* (2006.01)
  *H01L 21/56* (2006.01)
  *H01L 23/31* (2006.01)
  *H01L 23/538* (2006.01)

(56) References Cited

U.S. PATENT DOCUMENTS

| | | | |
|---|---|---|---|
| 8,174,117 B2 | 5/2012 | Ishido | |
| 8,198,546 B2* | 6/2012 | Kawamura | H01L 21/4846 |
| | | | 174/260 |
| 8,901,431 B2* | 12/2014 | Nishioka | H05K 3/4007 |
| | | | 174/255 |
| 8,997,341 B2 | 4/2015 | Ejiri et al. | |
| 9,240,382 B2 | 1/2016 | Hollis | |
| 9,786,588 B2 | 10/2017 | Kung et al. | |
| 9,914,989 B2 | 3/2018 | Kay et al. | |
| 10,197,423 B2* | 2/2019 | Lindballe | G01F 1/66 |
| 10,249,593 B2 | 4/2019 | Wickramanayaka et al. | |
| 2008/0149369 A1* | 6/2008 | Kawamura | H05K 3/3452 |
| | | | 174/251 |
| 2009/0095514 A1 | 4/2009 | Kaneko | |
| 2012/0152600 A1* | 6/2012 | Nishioka | H05K 3/3452 |
| | | | 174/258 |
| 2014/0145328 A1 | 5/2014 | Tummala et al. | |
| 2015/0014027 A1 | 1/2015 | Kaneko et al. | |
| 2016/0095219 A1* | 3/2016 | Sakamoto | H01L 24/14 |
| | | | 361/767 |
| 2017/0045387 A1* | 2/2017 | Lindballe | G01F 1/662 |
| 2018/0190577 A1* | 7/2018 | Gupta | H01L 23/49579 |
| 2019/0051603 A1 | 2/2019 | Horibe et al. | |
| 2020/0100369 A1* | 3/2020 | Martin | G02B 6/13 |

FOREIGN PATENT DOCUMENTS

| | | |
|---|---|---|
| CN | 101552211 A | 10/2009 |
| CN | 106298714 B | 2/2019 |
| CN | 109378308 A | 2/2019 |
| JP | 2012029418 A * | 2/2012 |
| KR | 1020140087541 A | 7/2014 |

OTHER PUBLICATIONS

Anonymous, "How do I prevent bridges while soldering SMD Components?" Jul. 2017, 1 page, https://electronics.stackexchange.com/questions/1848/custom-led-assembly-manufacturing/3181#3181.

Yamamoto, Michitaka, et al., "Comparison of Argon and Oxygen Plasma Treatments for Ambient Room-Temperature Wafer-Scale Au—Au Bonding Using Ultrathin Au Films," Micromachines, Feb. 2019, 12 pages, 10, 2.

Anonymous, "Kawai Laboratory, Nano/Micro System Engineering Laboratory," Department of Electrical, Electronic and Information Engineering, Nagaoka University of Technology Electronic Device and Photonics Engineering Course, Sep. 2019, 56 pages, http://kawai.nagaokaut.ac.jp/miniseminar2.html.

International Search Report for PCT/IB2020/057798 dated Nov. 22, 2020 (9 pages).

* cited by examiner

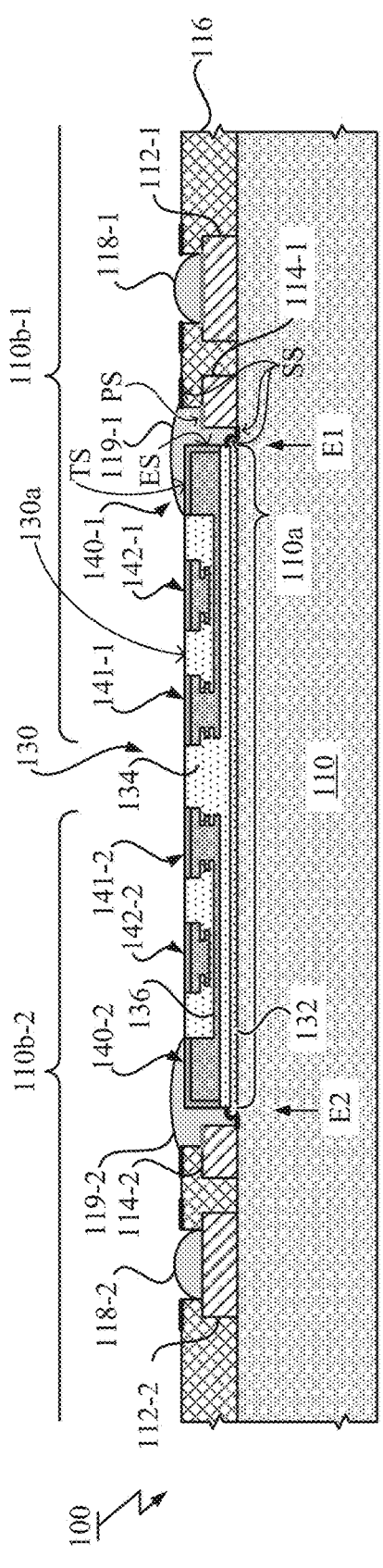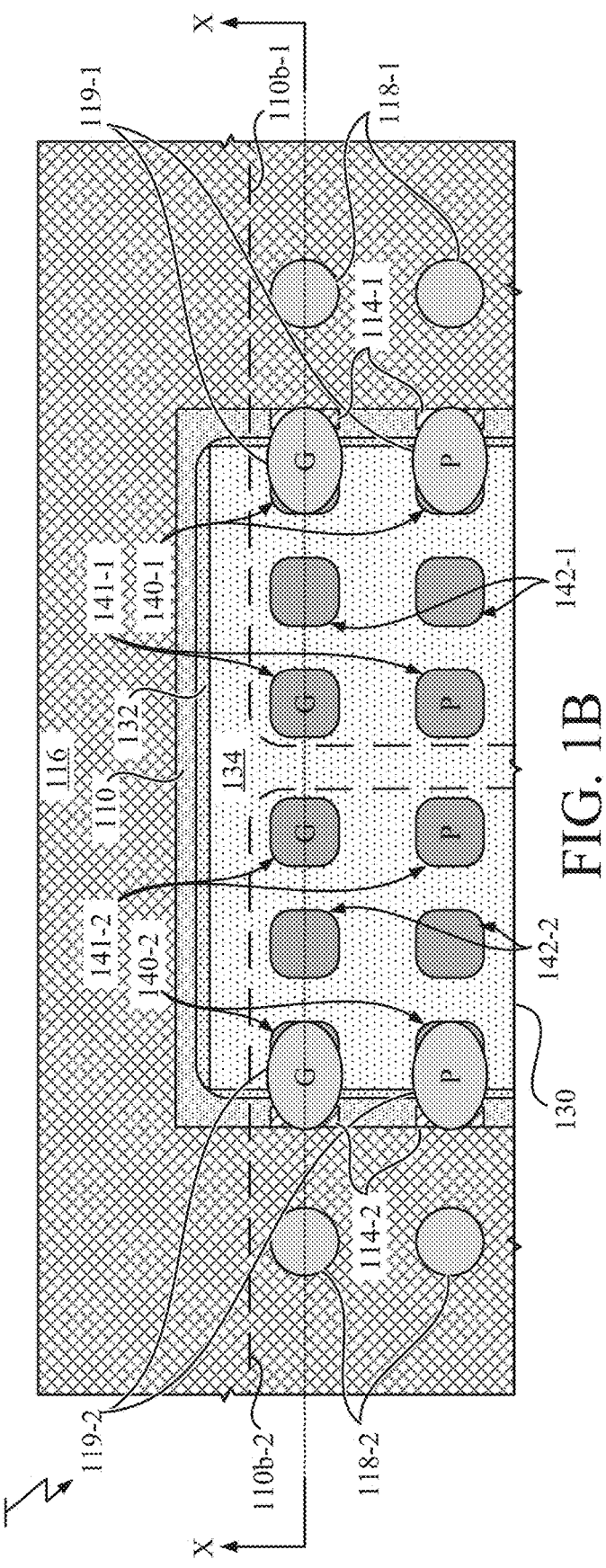
FIG. 1A
FIG. 1B

Roughen by #600, 80 degree Celsius

Roughen by #600, 250 degree Celsius

Roughen by #2400, 80 degree Celsius

Roughen by #2400, 250 degree Celsius

Smooth Ref, 80 degree Celsius

Smooth Ref, 250 degree Celsius

PREVENTION OF BRIDGING BETWEEN SOLDER JOINTS

BACKGROUND

The present disclosure, generally, relates to technique for soldering, more particularly, to methods of fabricating a connection structure, connection structures and electronic devices.

In response to growing demand for wide band signal transmission between chips, fine pitch interconnection with lead-free solder has been developed to enhance the performance of electronic devices. As the pitch width of the interconnection becomes fine, bridging across adjacent solder joints has become one of the major defects in wide variety of assembly technologies, including BGA (Ball Grid Array), QFP (Quad Flat Package), flip chip, etc.

SUMMARY

According to an embodiment of the present invention, a method of fabricating a connection structure is provided. The method includes providing a substrate that has a top surface and includes a set of pads for soldering, in which each pad has a pad surface exposed from the top surface of the substrate. The method also includes applying a surface treatment to both of at least a part of the top surface of the substrate close to the pads and the pad surface of each pad so as to make at least the part of the top surface and the pad surfaces of the pads rougher.

The connection structure, fabricated by the method according to an embodiment of the present invention, can prevent solder joints formed on adjacent pads from bridging when soldering. Application of the surface treatment, to enhance the surface roughness, improves wettability of the pad surfaces of the pads and de-wettability of the top surface of the substrate with respect to molten solder. Thereby, it is possible to improve reliability of solder joints even if pitches between the solder joints become fine. Furthermore, it is possible to reduce production cost and to improve production yield of the connection structure, and accordingly, electronic devices including the connection structure.

In a preferable embodiment, the top surface of the substrate has low wettability and the pad surface of each pad has high wettability for molten solder. The application of the surface treatment modifies both of different wetting characteristics of the exposed surfaces in respective strengthening directions. The top surface of the substrate having the low wettability becomes more non-wettable whereas the pad surface having the high wettability becomes more wettable.

In a particular embodiment, at least the part of the top surface of the substrate after application of the surface treatment has a roughness parameter (Ra) greater than 0.4 μm and lower than 2 μm.

In a particular embodiment, the pad includes metal material, and at least the part of the top surface adjacent to the pad includes organic material. In a further particular embodiment, the part including the organic material is provided by a member selected from a group including an organic substrate, a dielectric layer disposed on the substrate, a solder resist layer disposed on the substrate, an adhesive disposed on the substrate and combination thereof.

In a preferable embodiment, the surface treatment includes sandblasting. The sandblasting modifies the exposed surfaces mechanically and physically without altering chemical surface condition significantly. Also it is possible to control roughness of the pad surfaces of the pads and the part of the top surface of the substrate more precisely with a wider control range by using appropriate abrasive particles.

In a particular embodiment, the method further includes forming a set of solder joints, each of which is disposed on corresponding one of the pads.

In a preferable embodiment, the forming of the set of the solder joints includes applying solder material onto the pad surfaces of the pads and the part of the top surface of the substrate at least in part to which the surface treatment has been applied. The forming of the set of the solder joints further includes heating the solder material to form the set of the solder joints. The pad surface of the pads surrounded by the part of the top surface of the substrate to which the surface treatment has been applied is suitable for soldering process where the applied solder material is heated to complete the solder joints.

In a preferable embodiment, the substrate further includes an interconnection layer disposed on the substrate, the interconnection layer having an edge located next to the set of the pads and including a set of side connection pads located and exposed at the edge of the interconnection layer, each side connection pad being arranged with respect to a corresponding one of the pads disposed on the substrate. Introduction of novel side connection improves flexibility for routing of wiring with the interconnection layer. Thereby, it is possible to improve performance of an electronic device using the interconnection structure since the wiring can be optimized according to the improved routing flexibility. Also, it relaxes constraints on terminal layout of a chip that uses the interconnection layer. Since it is possible to prevent the side connections formed on the adjacent pads from bridging, yield and reliability of such electronic device are improved.

In a preferable embodiment, each side connection pad has a top surface exposed at a top surface of the interconnection layer and an edge surface exposed at the edge of the interconnection layer, in which the edge surface faces toward the corresponding one of the pads. Thereby, it is possible to improve reliability of the side connection and a manufacturing yield since both the edge surface and the top surface are involved in the side connection to increase a contact area.

In a particular embodiment, the method further includes forming a set of solder joints to connect the side connection pads of the interconnection layer with the pads disposed on the substrate, respectively.

According to other embodiment of the present invention, a method of fabricating a connection structure is provided. The method includes providing a substrate that has a top surface and includes a set of pads for soldering, each of which has a pad surface exposed from the top surface of the substrate. The top surface of the substrate has at least a part close to the pads to which a surface treatment of enhancing surface roughness has been applied. The pad surface of each pad has at least a part to which the surface treatment has been applied. The method further includes forming a set of solder joints, each of which is disposed on corresponding one of the pads.

The connection structure, fabricated by the method according to an embodiment of the resent invention, can prevent solder joints formed on adjacent pads from bridging when soldering. Application of the surface treatment of enhancing the surface roughness improves wettability of the pad surfaces of the pads and de-wettability of the top surface of the substrate with respect to molten solder. Thereby, it is possible to improve reliability of solder joints even if pitches between the solder joints become fine. Furthermore, it is possible to reduce production cost and to improve production yield of the connection structure and accordingly electronic devices including the connection structure.

According to other embodiments of the present invention, a connection structure that includes a substrate having a top surface and a set of pads for soldering, each of which has a pad surface exposed from the top surface of the substrate, is provided. In the connection structure, the top surface has a part close to the pads rougher than other part of the top surface and the pad surface of each pad is rougher than an exposed surface of other conductive material formed on the substrate.

According to other embodiments of the present invention, a connection structure that includes a substrate having a top surface and a set of pads for soldering, each of which has a pad surface exposed from the top surface of the substrate, is provided. In the connection structure, the substrate has at least a part of the top surface to which a surface treatment of enhancing surface roughness has been applied. Furthermore, each pad has at least a part of the pad surface to which the surface treatment has been applied.

The connection structures according to the embodiment of the present invention can prevent solder joints formed on adjacent pads from bridging when soldering. Application of the surface treatment of enhancing the surface roughness improves wettability of the pad surfaces of the pads and de-wettability of the top surface of the substrate for molten solder. Thereby, it is possible to improve reliability of solder joints even if pitches between the solder joints become fine.

According to another embodiment of the present invention, an electronic device that includes a substrate having a top surface and a set of pads for soldering, each of which has a pad surface exposed from the top surface of the substrate, is provided. In the electronic device, the substrate has a part of the top surface to which a surface treatment of enhancing surface roughness has been applied and each pad has a part of the pad surface to which the surface treatment has been applied.

The electronic device according to an embodiment of the present invention can improve reliability in terms of solder joints formed on adjacent pads. Application of the surface treatment of enhancing the surface roughness improves wettability of the pad surfaces of the pads and de-wettability of the top surface of the substrate for molten solder. Thereby, it is possible to improve reliability of solder joints even if pitches between the solder joints become fine.

In a particular embodiment, the electronic devices include a set of solder joints each disposed on corresponding one of the pads and one or more electronic components mounted on the substrate. Each electronic component uses at least one of the solder joints.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIG. 1A illustrates a schematic of an interconnection substrate according to an exemplary embodiment of the present invention.

FIG. 1B illustrates a schematic of an interconnection substrate according to an exemplary embodiment of the present invention.

DETAILED DESCRIPTION

Figure 2:
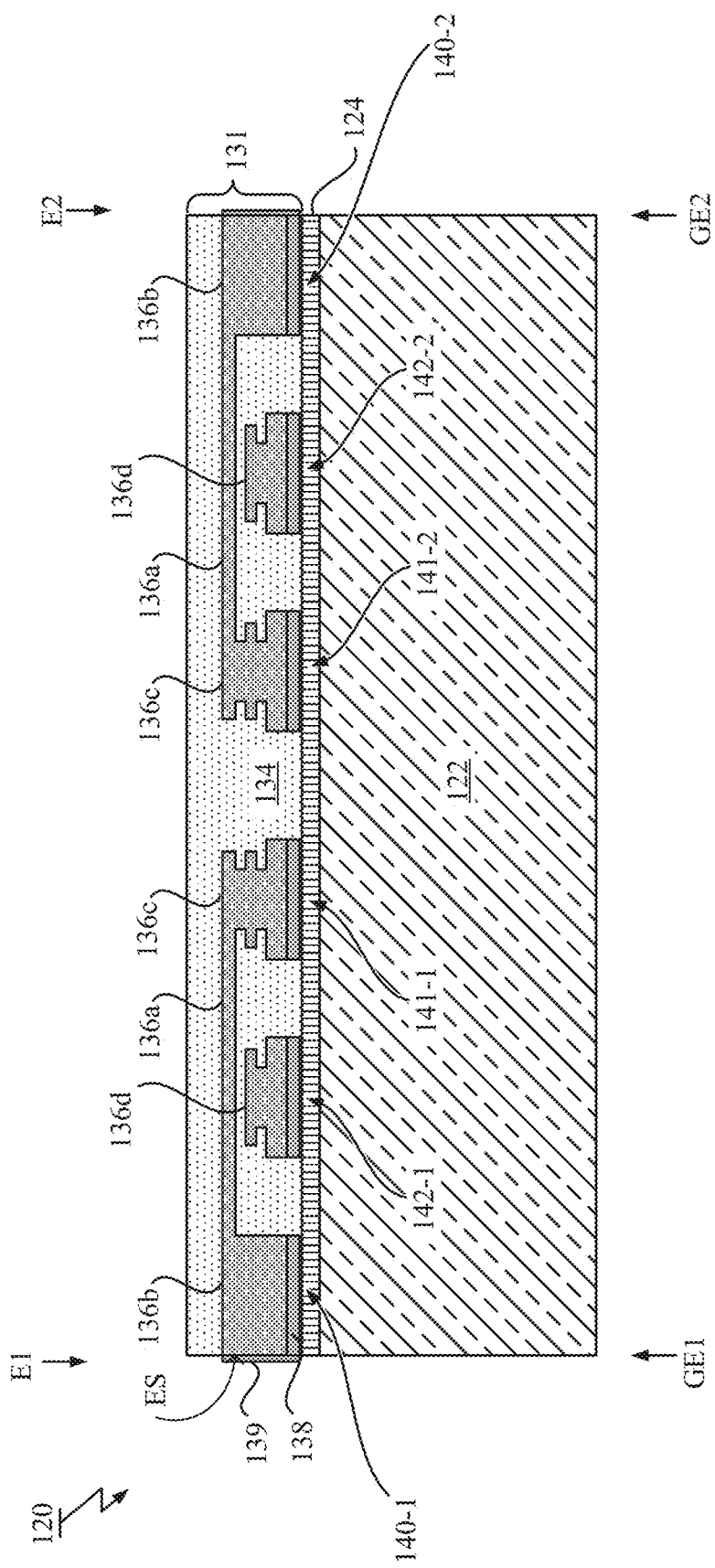
FIG. 2 illustrates a schematic of an interconnection layer carrying structure used for transferring an interconnection layer onto a target substrate according to an exemplary embodiment of the present invention.

Hereinafter, the present invention will be described with respect to particular embodiments, but it will be understood by those skilled in the art that the embodiments described below are mentioned only by way of examples and are not intended to limit the scope of the present invention. When describing embodiments with reference to FIGS. 1A through 13C, a plurality of identical elements may be identified with a collective reference numeral while each individual element of the plurality may be identified by an individual index reference numeral appended to the collective reference numeral, for example, a plurality of bond pads shown in FIG. 1A are collectively referenced by numeral 112 and each individual bond pad is referenced by numeral 112-1 and 112-2.

One or more embodiments according to the present invention are directed to a connection structure, an electronic device including a connection structure, a method of fabricating the connection structure, in which a pad surface for soldering and a part of a substrate surface close to the pad surface are subjected to a surface treatment of enhancing surface roughness to improve wettability of the pad surface for molten solder and de-wettability of the part of the substrate surface for the molten solder.

Hereinafter, referring to FIG. 1A and FIG. 1B, a schematic of an interconnection structure before chip mounting according to an exemplary embodiment of the present invention is described.

FIG. 1A and FIG. 1B illustrate a schematic of an interconnection substrate 100 for interconnecting chips to be mounted thereon. The interconnection substrate 100 corresponds to a connection structures after soldering. FIG. 1A and FIG. 1B show a cross-sectional view and a top view of the interconnection substrate 100, respectively. Note that the cross-sectional view shown in FIG. 1A corresponds to a cross-section indicated by "X" in the top view of FIG. 1B.

As shown in FIG. 1A, the interconnection substrate 100 includes an organic base substrate 110; a plurality of bond pads 112 used for chip bonding that is formed on the organic base substrate 110; a set of conductive pads 114 used for side connection that is formed on the organic base substrate 110; and an interconnection layer 130 disposed on the organic base substrate 110.

The organic base substrate 110 can be a build-up substrate having a core such as a glass epoxy core and an appropriate number of wiring layers with interlayer dielectrics, and can be fabricated by any standard build-up process. The bond pads 112 and the conductive pads 114 can be an outermost layer of the build-up substrate. Each bond pad 112 is connected to a signal line via the writing in the organic base substrate 110. Each conductive pad 114 is connected to a power supply or ground line that can work as a signal return current path, which is a path the current takes to return to the source, via the writing in the organic base substrate 110. The bond pads 112, the conductive pads 114 and wiring are made of any one of metal materials (e.g., Cu, Al, etc.) and other conductive materials. In a particular embodiment, metal copper can be used. Note that an internal structure inside the organic base substrate 110 is omitted from the drawings for a purpose of illustration. Also note that the organic base substrate 110 is employed as a substrate in the described embodiment. However, an inorganic substrate such as a glass substrate can also be employed as the substrate.

In a particular embodiment, the interconnection substrate 100 also includes a solder resist layer 116 formed on the organic base substrate 110. Each bond pad 112 can be covered by the solder resist layer 116 and exposed from the solder resist layer 116 through an opening formed therein. Each bond pad 112 can have a pre-solder 118 formed within the opening of the solder resist layer 116. Also each conductive pad 114 can be covered by the solder resist layer 116 in part and exposed from the solder resist layer 116 at one edge close to the interconnection layer 130 disposed on the organic base substrate 110. The thickness of the pads 112, 114 can typically range from 1 to 20 micrometers. The thickness of the solder resist layer 116 can be in the range of its adequate film thickness and can typically range from 2 to 50 micrometers. Note that the solder resist layer 116 that can be an organic material can be used as an insulation layer disposed on the organic base substrate. However, instead of using the solder resist layer 116, a dielectric layer of insulation material such as inorganic insulation material other than solder mask material is also contemplated.

The plurality of the bond pads 112 can be divided into a plurality of groups. One group of bond pads (hereinafter, referred to as a first group) 112-1 are positioned at a flip-chip area (referred to as a first flip-chip area) 110b-1 on the interconnection substrate 100. Other group of bond pads (hereinafter, referred to as a second group) 112-2 are positioned at a different flip-chip area (referred to as a second flip-chip area) 110b-2 on the interconnection substrate 100. The second group of the bond pads 112-2 can be located at a distance from the first group of the bond pads 112-1. Note that the pre-solders 118-1, 118-2 formed on the bond pads 112-1, 112-2 are depicted in the top view of FIG. 1B. The first and the second flip-chip areas 110b-1, 110b-2 are areas where one chip (hereinafter, referred to as a first chip) and other chip (hereinafter, referred to a second chip) would be mounted after subsequent chip mounting process, respectively.

The interconnection layer 130 is disposed on the top surface of the organic base substrate 110 and located within a defined area 110a between the first and second groups of the bond pads 112-1, 112-2. The defined area 110a where the interconnection layer 130 is disposed has no solder resist. The interconnection layer 130 can be precisely positioned at the defined area 110a by using an appropriate alignment mark and attached to the organic base substrate 110. Note that the defined area 110a for the interconnection layer 130 overlaps with both of the first and the second flip-chip areas 110b-1, 110b-2 in part. Also the defined area 110a where the interconnection layer 130 is disposed can be recessed to adjust the levels of the top surface of the interconnection layer 130 and the top surface of the solder resist layer 116.

The interconnection layer 130 is bonded to the top surface of the organic base substrate 110 by an adhesive 132. A paste or liquid type or a film type adhesive material can be used for the adhesive 132.

Further referring to FIG. 1A, the structure of the interconnection layer 130 is depicted in more detail. The interconnection layer 130 includes an organic insulation material 134; a conductive pattern 136 embedded in the organic insulation material 134; and a plurality of pads 140, 141 and 142 exposed at the top surface 130a of the interconnection layer 130, which can be provided by the organic insulation material 134. The pads 140, 141 and 142 of the interconnection layer 130 are divided into two types. First type is side connection pads 140 used for the side connection and second type is bond pads 141, 142 used for the chip bonding.

Note that the organic insulation material 134 is employed as insulation material for the interconnection layer 130 in the described embodiment. The organic material is preferable for a case where the organic base substrate 110 is employed, in order to alleviate CTE mismatch between the interconnection layer 130 and the organic base substrate 110, which is typically used as a package substrate. However, the insulation material is not limited to organic material. In other embodiment, inorganic insulation material can also be employed as the insulation material.

In the described embodiment, as representatively described for the first flip-chip area 110b-1, the interconnection layer 130 has an edge E1 and E2 located next to the sets of the conductive pads 114-1 and 114-2 disposed on the organic base substrate 110. The set of the side connection pads 140-1 is located and exposed at the edge E1. Each side connection pad 140-1 is arranged with respect to a corresponding one of the conductive pads 114-1 disposed on the organic base substrate 110. When the set of the conductive pads 114-1 is arranged in a line along one edge close to the interconnection layer 130 with a predetermined interval (e.g., pitch width), the set of the side connection pads 140-1 is also arranged in a line along the edge E1 of the interconnection layer 130 with a predetermined interval (e.g., pitch width) that matches the interval of the conductive pads 114-1. Although there is no particular limitation, in a particular embodiment, the side connection pads 140-1 and the conductive pads 114-1 have a one-to-one relationship.

Each side connection pad 140 has a top surface TS exposed at the top surface 130a of the interconnection layer 130 and an edge surface ES exposed at one edge (e.g., E1 and E2) of the interconnection layer 130. The top surface TS is parallel to the top surface of the organic base substrate 110 whereas the edge surface ES is perpendicular to the top surface of the organic base substrate 110 and faces toward the corresponding one of the conductive pads 114. In a preferable embodiment, the edge surface ES and/or the top surface TS of each side connection pad 140 have a barrier metal layer. Examples of the barrier metal layer include a stack of Au/Pd/Ni and a stack of Au/Ni where first element (e.g., Au for both cases) is the top in the stack, an Au layer and a Pd layer. Note that symbols such as Au, Pd, Ni, and the like represent a main element contained in each layer of the stack, which can contain a small or trace amount of other elements to form alloy and/or can also contain a small or trace amount of additives due to the manufacturing process. Also note that each of the bond pads 112 and the conductive pads 114 disposed on the organic base substrate 110 can also or may not have a similar barrier metal layer.

As shown in FIG. 1A and FIG. 1B, the interconnection substrate 100 can also include a set of solder joints 119, each of which connects one side connection pad 140 of the interconnection layer 130 with one corresponding conductive pad 114 disposed on the organic base substrate 110. Each solder joint 119 contacts exposed surfaces of the side connection pad 140 (the top surface TS and the edge surface ES) and the conductive pad 114. Note that the solder joints 119-1, 119-2 formed on the conductive pads 114-1, 114-2 and the side connection pads 140-1, 140-2 are also depicted in the top view of FIG. 1B. A symbol 'G' denotes a ground whereas a symbol 'P' denotes a power supply.

In the described embodiment, the pads 112, 114 and the substrate has respective surfaces (pad surfaces PS of the conductive pads 114 and the bond pads 112 and a substrate surface SS around the conductive pads 114 and the bond pads 112) to which a surface treatment of enhancing surface roughness has been applied. In one or more embodiments, the surface treatment includes sandblasting and/or a plasma treatment. Hence, the conductive pad 114 has a pad surface PS that is exposed from the substrate surface SS and is rougher than exposed surface of other untreated pads. The bond pad 112 also has a pad surface PS exposed from the substrate surface SS and rougher than exposed surface of other untreated pads. Also the substrate has a part of the substrate surface SS close to the conductive pads 114 and the bond pads 112 rougher than other part of the substrate surface.

Note that the substrate surface SS is defined as a surface of a part that includes the organic base substrate 110 as a substrate body and the solder resist layer 116 formed on the substrate body. The substrate surface SS can include a top surface of the solder resist layer 116, a top surface of the organic base substrate 110 where there is no solder resist, no interconnection layer and no adhesive, and/or a surface of the adhesive 132 at least in part.

The substrate surface SS can be provided by organic material of the solder resist layer 116, the organic base substrate 110 and/or the adhesive 132 and has low wettability for molten solder. The pad surface PS of each of the conductive pads 114 and the bond pads 112 has high wettability for molten solder. Note that term 'low wettability' means that the surface has a contact angle greater than 90 degrees ($90°<\theta\leq180°$) whereas term 'high wettability' means that the surface has a contact angle less than 90 degrees (0<θ<90°). Also note that the contact angle (θ) is an angle at which a liquid-air interface meets a solid-liquid interface where the liquid is the molten solder and the solid is the conductive material of the pad 112, 114 or the organic material of the substrate, and provides an inverse measure of wettability.

In a particular embodiment, the part of the substrate surface SS after application of the surface treatment has a roughness parameter (Ra) greater than 0.4 μm and lower than 2 μm, more preferably greater than 0.5 μm and lower than 1 μm, as long as the thickness of the solder resist layers after the surface treatment is kept sufficiently, where Ra represents arithmetic average roughness. In terms of other roughness parameter, the part of the substrate surface SS can have a roughness parameter (Rq) greater than 700 nm and lower than 4 μm, more preferably greater than 0.8 μm and lower than 2 μm, where Rq represents root mean squared roughness. The same can hold for the pad surface PS.

Further note that each of the pads 140, 141, 142 of the interconnection layer 130 also can have a pad surface exposed from the top surface 130a of the interconnection layer 130 and rougher than exposed surface of other untreated pads to which no surface treatment of enhancing surface roughness is applied. Also the top surface 130a of the interconnection layer 130 can have a part close to the pads 140, 141, 142 rougher than other part of the interconnection layers 130 to which no surface treatment of enhancing surface roughness is applied.

In the described embodiment, as representatively described for the first flip-chip area 110b-1, the side connection pads 140-1, the conductive pad 114-1 and accordingly the solder joints 119-1 are located within the flip-chip area 110b-1. The same holds for other flip-chip area 110b-2. However, positions of the side connections (the side connection pads 140, the conductive pads 114 and the solder joints 119) are not limited. In other embodiment, the side connections are placed at positions away from the flip-chip areas 110b since the side connections are not involved directly in the chip bonding.

Here, focusing again to the structure of the interconnection layer 130, the bond pads 141, 142 are exposed from the organic insulation material 134 at the top surface 130a of the interconnection layer 130. The bond pads 141, 142 of the interconnection layer 130 are used for mounting chips disposed thereon in conjunction with the bond pads 112 disposed on the organic base substrate 110. In the described embodiment, the bond pads 141, 142 of the interconnection layer 130 are functionally divided into two types. First type is a first bond pad 141 used for power supply or ground and second type is a second bond pad 142 used for signal transmission between the chips.

Each first bond pad 141 used for power supply or ground is connected, via wiring (which is a part of the conductive pattern 136) embedded in the organic insulation material 134, to a corresponding side connection pad 140 that is further connected to the power supply or ground line of the organic base substrate 110 through the solder joint 119.

The bond pads 141, 142 of the interconnection layer 130 are also divided into a plurality of groups in terms of connection partner. One group of bond pads (hereinafter, referred to as a first set) 141-1, 142-1 are positioned at the first flip-chip area 110b-1 and other group of bond pads (hereinafter, referred to as a second set) 141-2, 142-2 are positioned at the second flip-chip area 110b-2. Although not shown in FIG. 1A, one bond pad 142-1 in the first set is electrically connected to a corresponding bond pad 142-2 in the second set by wiring or a trace (which is also a part of the conductive pattern 136) embedded into the organic insulation material 134. Note that conductive pattern 136 can include a plurality of conductive layers with one or more interlayers of the organic insulation material, in which parts of adjacent conductive layers are connected by a conductive via formed through the interlayer. Also the conductive pattern 136 includes a plurality of electrical paths isolated by the organic insulation material.

In FIG. 1A, it is described that the bond pad 141-1 is connected to the side connection pad 140-1 that is located within the same flip chip area 110b-1 and not connected to other side connection pad 140-2 located within the different flip chip area 110b-2. However, since the power supply and the ground can be shared between the plural chips, the power supply or ground line for the first chip can be connected to the same line for the second chip.

Note that there are merely four bond pads 141, 142, two solder joints 119 (two side connection pads 140 and two conductive pads 114) and two bond pads 112 of the organic base substrate 110 for each chip in FIG. 1B. However, the number of bond pads, the number of solder joint (hence, the number of side connection pads and the number of conductive pads) and the number of the bond pads of the organic base substrate 110 for each chip are not limited and can depend on the specification of the chip. Also the number of flip chip areas is not limited to two.

As described later, the first set of the bond pads 141-1 142-1 of the interconnection layer 130 and the first group of the bond pads 112-1 of the organic base substrate 110 are formed in a 2-dimensional array and configured to receive terminal bumps of the first chip. The same holds for other chips.

In the described embodiment, the interconnection layer 130 shown in FIG. 1 can be attached onto the organic base substrate 110 by using a novel interconnection layer carrying structure. Hereinafter, referring to FIG. 2, an interconnection layer carrying structure 120 used for transferring an interconnection layer onto a target substrate according to an exemplary embodiment of the present invention is described.

FIG. 2 illustrates a schematic of an interconnection layer carrying structure that can be used for transferring an interconnection layer 130 onto the organic base substrate 110 to fabricate the interconnection substrate 100 shown in FIGS. 1A and 1B. The view shown in FIG. 2 is a cross-sectional view of the interconnection layer carrying structure 120.

As shown in FIG. 2, the interconnection layer carrying structure 120 includes a support substrate 122; a release layer 124 formed on the support substrate 122; and an interconnection layer part 131 formed on the release layer 124. Note that the interconnection layer part 131 shown in FIG. 2 corresponds to the interconnection layer 130 shown in FIG. 1 and is illustrated with its top and bottom surfaces being faced in upside down with respect to the view shown in FIG. 1A.

The support substrate 122 is a rigid and stable substrate used to fabricate the interconnection layer part 131 thereon. The support substrate 122 is suitably any substrate as long as it provides adequate rigidity and stability. In one or more embodiments, the support substrate 122 can be an inorganic substrate including glass, semiconductor such as silicon, ceramic, etc. In a preferable embodiment, the support substrate 122 is a glass substrate since the glass substrate has transparency and thermal expansion coefficient (CTE) (3~12 ppm/degrees Celsius) closer to that of organic material used to build the interconnection layer part 131 in comparison with silicon substrate, for example. Examples of such glass substrate can include soda lime glass, borosilicate glass, fused silica, synthetic quartz glass, to name but a few.

The release layer 124 is a release coating configured to release the interconnection layer part 131 from the support substrate 122 by appropriate treatment. When the support substrate 122 has transparency, UV (ultraviolet)/IR (infrared)/visible light can be irradiated to the release layer 124 from the back side of the support substrate 122 so as to release the interconnection layer part 131 from the support substrate 122.

In one or more embodiments, the release layer 124 can be any known light sensitive release layer that allows debonding from the support substrate interface with laser illumination in the field of wafer bonding/de-bonding technology. In a particular embodiment, a light-to-heat conversion release coating, which converts absorbed light energy to heat, can be used as the release layer 124. In these particular embodiments, the release layer 124 can be burned, broken down or decomposed by ablating the release layer 124 using laser illumination after the interconnection layer part 131 is fixed to the organic base substrate 110. In other embodiments, the release layer 124 can be a thermal or UV-releasable adhesive layer whose adhesive property disappears or degrades by heat or UV irradiation. Residual of the release layer 124 can be cleaned after releasing if necessary. In further other embodiments, any of the known de-bonding methods including mechanical peel-off method, thermal slide-off method and solvent release method can be employed.

As described by referring to FIG. 1, the interconnection layer part 131 includes the organic insulation material 134; the plurality of the pads 140-142 that face towards the support substrate 122 and are embedded in the organic insulation material 134; the plurality of the traces (or wiring) 136a-136d embedded in the organic insulation material 134.

Although not shown in FIG. 2, in a particular embodiment where film type adhesive material is used for the adhesive 132 in FIG. 1, the interconnection layer part 131 can further include an adhesive layer that is formed on a top of the organic insulation material 134 and can fully cover the top surface of the organic insulation material 134.

The plurality of the pads 140-142 includes the side connection pads 140, the first bond pads 141 for power supply or ground and the second bond pads 142 for signal transmission. Each side connection pad 140 is configured to be connected, by a solder joint 119, to a corresponding conductive pad 114 disposed on the organic base substrate 110, to which the interconnection layer part 131 is transferred, as shown in FIG. 1. The plurality of the pads 140-142 are divided into a plurality of groups, including the first set of the pads 140-1, 141-1, 142-1 and the second set of the pads 140-2, 141-2, 142-2. Each pair of the side connection pad 140-1 and the corresponding bond pad 142-1 is electrically coupled by the traces 136a. Each pair of the bond pad 142-1 and the corresponding bond pad 142-2 is electrically coupled by a trace (the trace for connecting the bond pads 142-1, 142-2 is not shown in FIG. 2).

The organic insulation material 134 can be disposed on the release layer 124. In the described embodiment, the top surface of the organic insulation material 134 can be flat and bare surface. In other embodiment, the top surface of the organic insulation material 134 can be covered by an adhesive layer. The pads 140-142 can be exposed at a bottom surface from the organic insulation material 134 and in touch with the release layer 124. In the described embodiment, each pad 140-142 includes a barrier metal layer 138 formed on the release layer 124. Each pad 140-142 can further include a seed metal layer, which can be used to deposit conductive material (e.g., the barrier metal layer 138 and a pad body) at a bottom surface thereof (corresponding to the top surface TS) on the release layer 124 by electrolytic plating. In the preferable embodiment, each side connection pad 140 further includes a barrier metal layer 139 formed at the edge surface ES thereof.

The organic insulation material 134 can be any one of photosensitive insulating resins such as PI (polyimide), BCB (benzocyclobutene), PBO (polybenzoxazole) or other photosensitive polymers. Use of the organic insulation material alleviates CTE mismatch between the interconnection layer 130 and the organic base substrate 110. The conductive pattern 136 can be made of any one of metal materials (e.g., Cu, Al, etc.) and other conductive materials. In a particular embodiment, metal copper can be used for the conductive pattern 136. The barrier metal layer 138, 139 can be, but not limited to, a stack of Au/Pd/Ni or a stack of Au/Ni where first element (e.g., Au for both cases) is the bottom layer in the stack in FIG. 2, an Au layer, or a Pd layer.

In the described embodiment, the edges E1, E2 of the interconnection layer part 131 are aligned with the edges GE1, GE2 of the support substrate 122. As shown in FIG. 2, the interconnection layer part 131 is provided as being fabricated on the support substrate 122 in a form of tape that is formed by organic material and held by the support substrate 122 as a rigid backing material. The interconnection layer carrying structure 120 can be fabricated by repeatedly performing photolithography process with photosensitive organic material and appropriate plating resist material.

Hereinafter, referring to a series of FIGS. 3A-3C, FIGS. 4A-4C and FIGS. 5A-5C, a process for fabricating an interconnection substrate 100 (shown in FIG. 1A, for example) according to an exemplary embodiment of the present invention is described. FIGS. 3A-3B and FIGS. 4A-4C illustrate cross-sectional views of structures obtained during the fabrication process of the interconnection substrate 100. FIGS. 5A-5C illustrate cross-sectional views of structures obtained when forming solder joints during the fabrication process of the interconnection substrate.

Figure 3A:
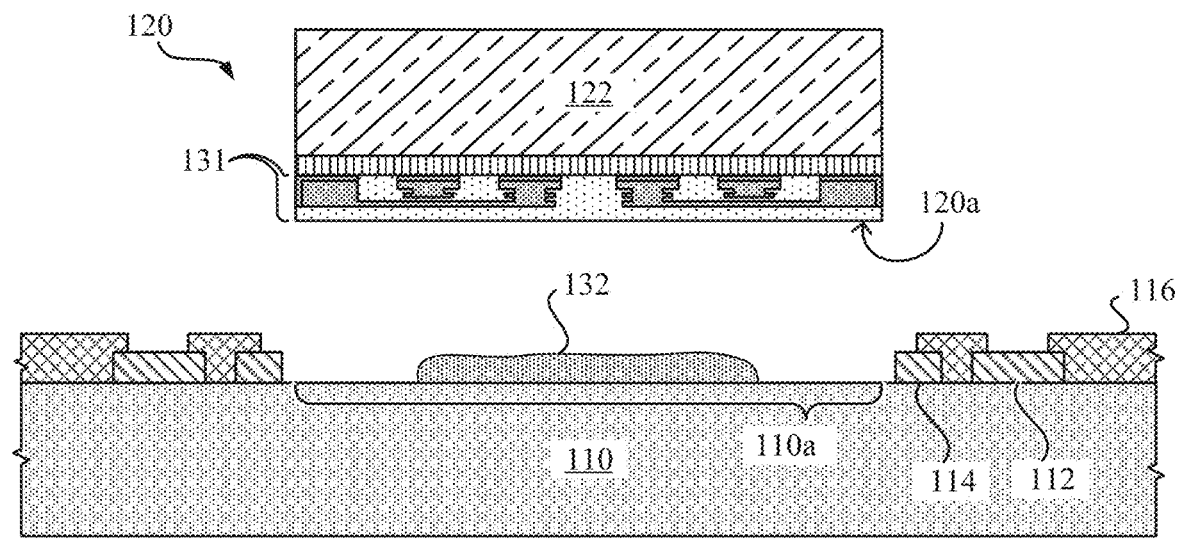
FIG. 3A illustrates cross-sectional views of structures obtained during a fabrication process of the interconnection substrate according to an exemplary embodiment of the present invention.

As shown in FIG. 3A, the fabrication process of the interconnection substrate 100 can include a step of providing the organic base substrate 110 and the interconnection layer carrying structure 120. The organic base substrate 110 prepared by this step can include the plurality of the bond pads 112, the set of the conductive pads 114 and the solder resist layer 116 disposed on the organic base substrate 110. Note that there is a defined area 110a on the organic base substrate 110 where no solder resist layer is present.

As shown in FIG. 3A, the fabrication process can further include a step of applying an adhesive 132 onto the organic base substrate 110 within the defined area 110a. In the described embodiment, a paste or liquid type adhesive material, which can have been conventionally used as an underfill when bonding chips with substrates, is used for the adhesive 132. Use of the paste or liquid type adhesive makes it possible to prevent the occurrence of voids in the adhesive 132. However, in a particular embodiment where an adhesive of film type adhesive material is formed on a top 120a of the interconnection layer part 131, the step of applying the adhesive 132 can be omitted.

Figure 3B:
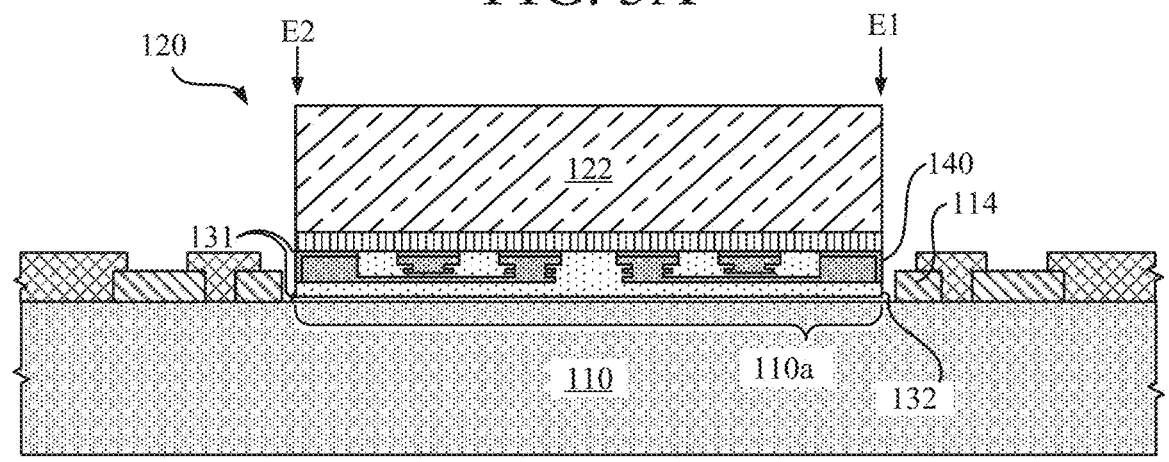
FIG. 3B illustrates cross-sectional views of structures obtained during a fabrication process of the interconnection substrate according to an exemplary embodiment of the present invention.

As shown in FIG. 3B, the fabrication process can include a step of placing the interconnection layer carrying structure 120 onto the organic base substrate 110 such that the edges E1, E2 of the interconnection layer part 131 are located next to the respective sets of the conductive pads 114 and each side connection pad 140 is arranged with respect to a corresponding one of the conductive pads 114 disposed on the organic base substrate 110. The interconnection layer carrying structure 120 can be placed onto the organic base substrate 110 by using a bonder in a upside down manner such that the pads 140-142 faces up and the bare surface of the organic insulation material 134 face down. The bottom of the organic insulation material 134 is attached to the top surface of the organic base substrate 110 within the defined area 110a.

Since the bond pads 141, 142 of the interconnection layer part 131 and the bond pads 112 on the organic base substrate 110 are configured to receive bumps of chips to be mounted, the interconnection layer carrying structure 120 is positioned precisely at the defined area 110a by using an appropriate alignment mark that can be formed on the organic base substrate 110 in advance. The fabrication process can further include a step of curing the adhesive 132 so as to firmly bond the interconnection layer part 131 to the organic base substrate 110 after the step of placing the interconnection layer carrying structure 120 onto the organic base substrate 110.

Note that, in other embodiment, applying the adhesive 132 can be performed after the placement of the interconnection layer carrying structure 120 by way of capillary or injection flow method.

Figure 3C:
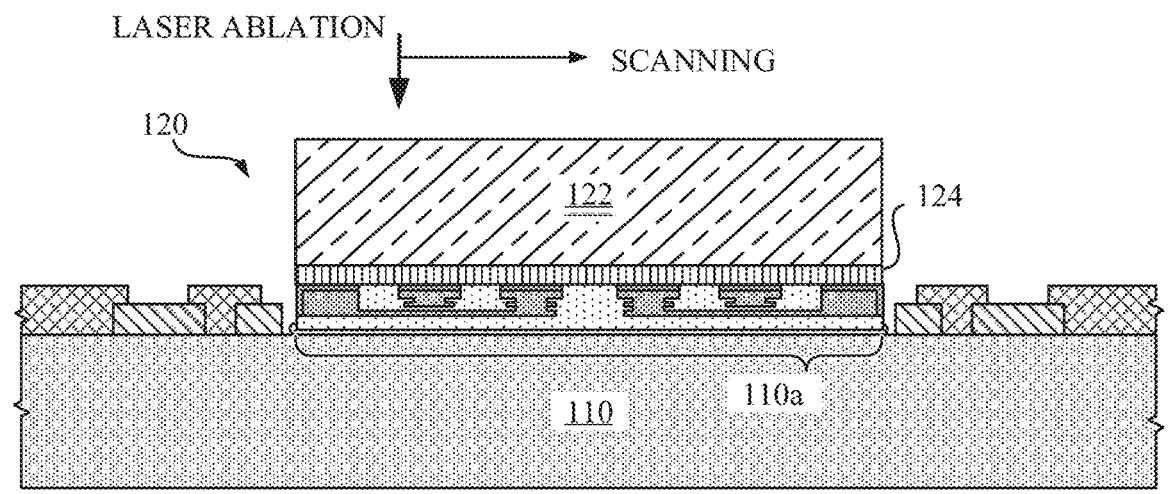
FIG. 3C illustrates cross-sectional views of structures obtained during a fabrication process of the interconnection substrate according to an exemplary embodiment of the present invention.

As shown in FIG. 3C, the fabrication process can include a step of releasing the interconnection layer part 131 from the support substrate 122 by removing the release layer 124. In a particular embodiment, the support substrate 122 has transparency and the step of releasing from the support substrate 122 can be done by ablating the release layer 124 with laser illumination through the support substrate 122 while scanning the laser beam.

By performing aforementioned steps, the interconnection layer part 131 is transferred from the interconnection layer carrying structure 120 to the organic base substrate 110 at the defined area 110a to obtain an interconnection layer 130 attached on the organic base substrate 110. The releasing step shown in FIG. 3C leaves the interconnection layer 130 on the organic base substrate 110 such that the set of the pads 140-142 faces in a direction opposite to the organic base substrate 110.

Although not shown in the drawing, the fabrication process can also include a step of performing cleaning of residuals on a top of the interconnection layer 130, which can include residuals of the release layer 124, after the step of removing the release layer 124. The cleaning of the residuals can be performed by virtually any standard means including $O_2$ plasma irradiation. In a particular embodiment, the fabrication process can also include a step of performing an etching of surfaces of the pads 140-142, which can include a seed metal layer formed on the pads 140-142, to expose bare surface of the metal stack 138, after the step of removing the release layer 124.

Figure 4A:
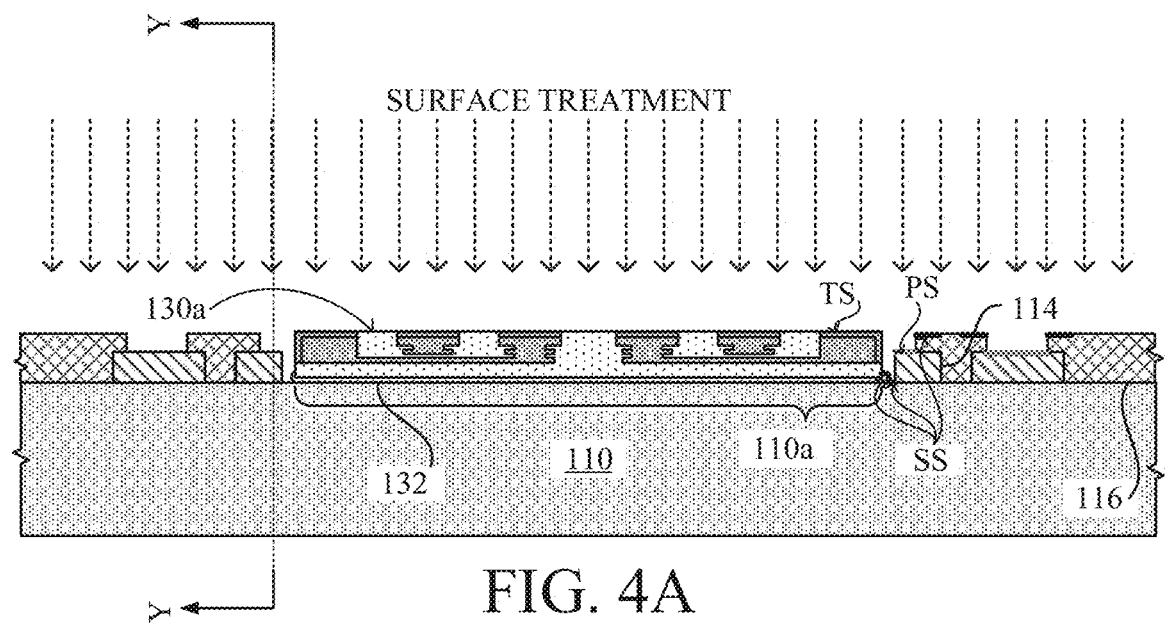
FIG. 4A illustrates cross-sectional views of structures obtained during the fabrication process of the interconnection substrate according to the exemplary embodiment of the present invention.
Figure 5A:
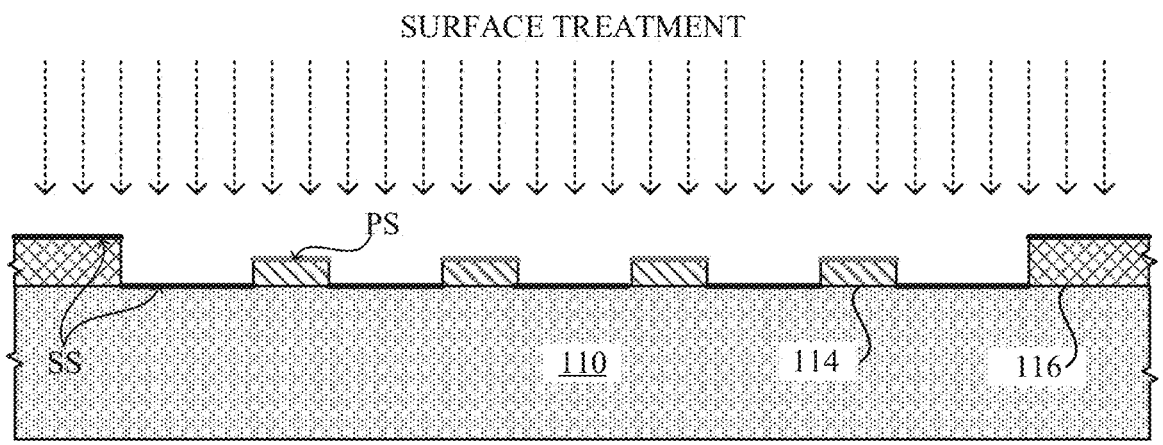
FIG. 5A illustrates cross-sectional views of structures obtained when forming solder joints during the fabrication process of the interconnection substrate according to the exemplary embodiment of the present invention.
Figure 5B:
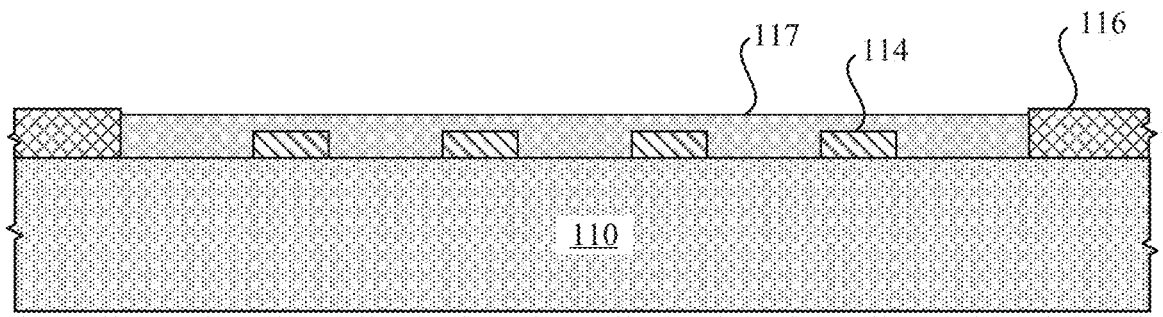
FIG. 5B illustrates cross-sectional views of structures obtained when forming solder joints during the fabrication process of the interconnection substrate according to the exemplary embodiment of the present invention.
Figure 5C:
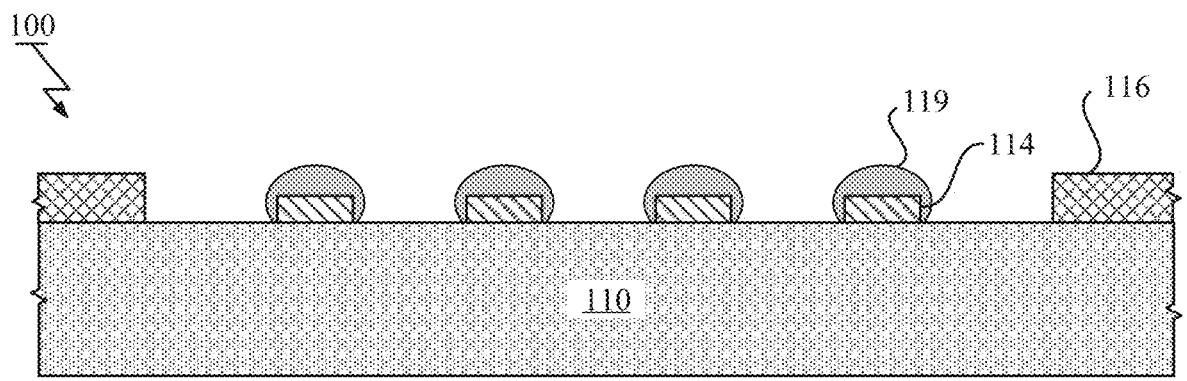
FIG. 5C illustrates cross-sectional views of structures obtained when forming solder joints during the fabrication process of the interconnection substrate according to the exemplary embodiment of the present invention.

As shown in FIG. 4A and FIG. 5A, the fabrication process can include a step of applying a surface treatment of enhancing surface roughness to exposed pad surfaces PS of the conductive pads 114 and the bond pad 112 and a part of the exposed substrate surface SS around the conductive pads 114 and the bond pad 112. Note that the cross-sectional views shown in FIG. 5A-5C corresponds to a cross-section indicated by "Y" in the cross-sectional view of FIG. 3A-3C, respectively. Examples of such surface treatment of enhancing surface roughness include sandblasting (abrasive blasting) and plasma treatment.

In a preferable embodiment, sandblasting is employed as the surface treatment. The sandblasting can be conducted by using an appropriate abrasive media of a particle size under an appropriate condition such as collision speed of the abrasive media. There is a plurality of types, which includes dry blasting and wet blasting. The wet blasting, in which the abrasive media and the liquid such as water are sprayed at a work piece, is preferable since the wet blasting has an ability to use finer abrasive media than the dry blasting. The sandblasting is preferable since the sandblasting modifies the exposed surfaces mechanically and physically without affecting chemical surface conditions significantly. Also it is possible to control roughness of the exposed surfaces more precisely with a wider control range by using appropriate abrasive particles.

In a particular embodiment, a plasma treatment is employed as the surface treatment. The plasma treatment can use Argon (Ar) plasma, Oxygen ($O_2$) plasma or mixture thereof. The plasma treatment using Ar plasma can be preferably employed since Ar plasma has an ability to prevent oxidation. However, $O_2$ plasma treatment is also contemplated in a case where the pads 112, 114 are protected by precious metal layers such as an Au layer formed on the top, for example. The plasma treatment can be conducted under an appropriate condition, which can include RF (radio frequency) power, accelerating voltage, flow rate of gas, application time, etc. such that sufficient enhancement of surface roughness is obtained.

Although plasma treatments are often applied to a target surface to remove organic residual to clean the surface and/or to functionalize the surface for modifying surface characteristics chemically, the plasma treatment according to the exemplary embodiment is different from such plasma treatment for cleaning and/or surface functionalization in terms of the aim and the conditions. In order to make the target surface sufficiently rougher, the plasma treatment is applied for an extended period of time with respect to the duration used for cleaning and/or surface functionalization. Also, the effectiveness of the plasma treatment for enhancing the surface roughness persists for a relatively long time. In contrast, the effectiveness of the plasma treatment in terms of cleaning and/or surface functionalization is short lived since the cleaned surface tends to be contaminated over time and the surface condition changes over time, hence the effectiveness decays with time. Also, since the plasma treatment, especially $O_2$ plasma treatment, can make the resin surface more hydrophilic due to interaction between active species and the surface molecules, it is preferable to leave the exposed surface of the solder resist layer 116 after the plasma treatment for a while until the hydrophilicity decays sufficiently.

Figure 6:
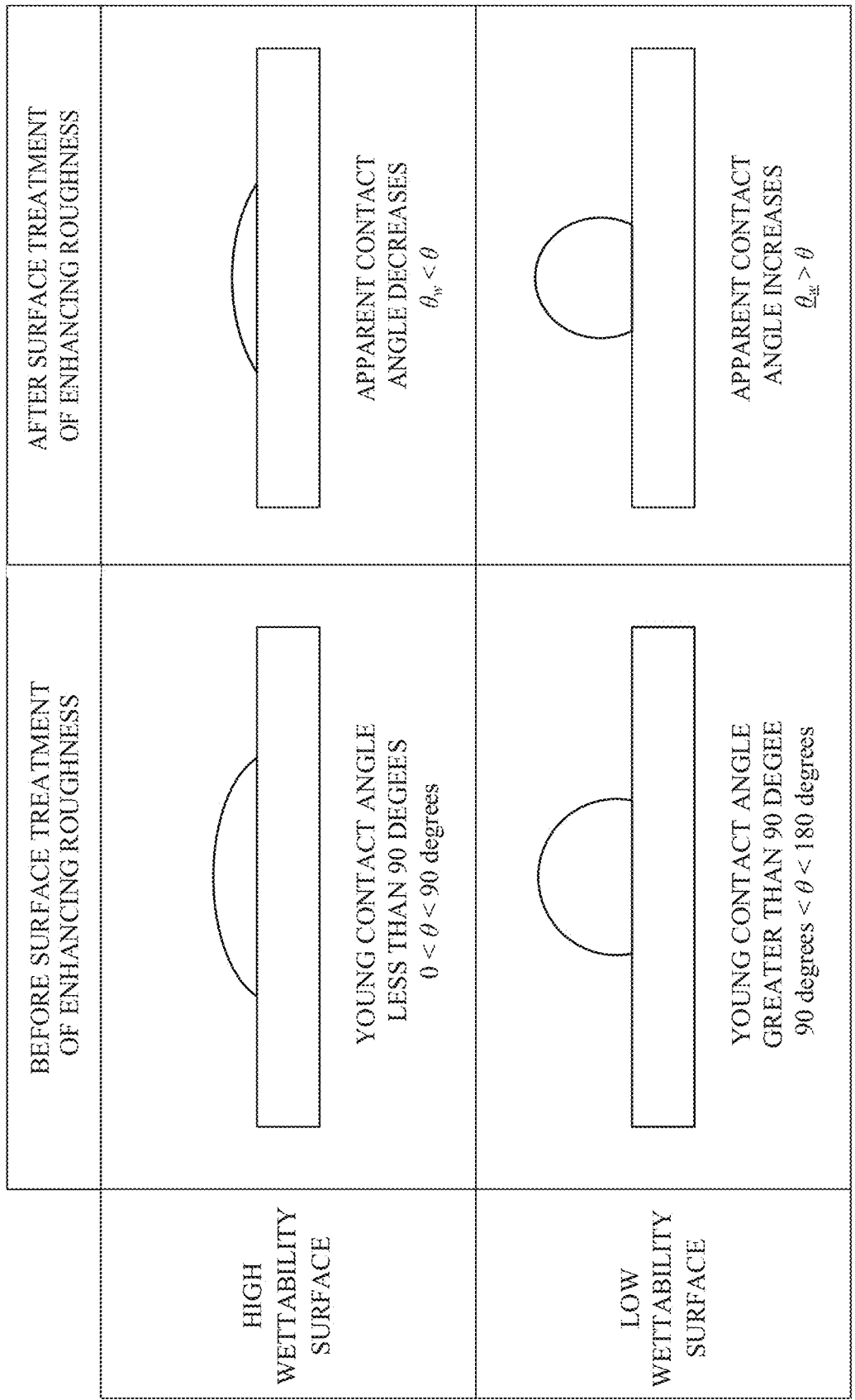
FIG. 6 describes a schematic of a surface treatment of enhancing surface roughness according to the exemplary embodiment of the present invention.

FIG. 6 describes a schematic of a surface treatment of enhancing surface roughness according to the exemplary embodiment of the present invention. As illustratively described in FIG. 6, enhancement of the surface roughness improves solder wettability of a surface having high wettability while improving de-wettability of a surface having low wettability. The wettability of molten solder depends on the surface roughness of the solid components when the material of three phases is identical. The wettability is represented by a contact angle in Wenzel's equation as follows:

$$\cos \theta_w = r \cos \theta,$$

where $\theta_w$ denote an apparent contact angle, $\theta$ denotes a Young's contact angle and r represents a roughness ratio (r=1 for smooth surface and r>1 for rough surface).

When the surface irregularities are so fine that air remains at the interface and forms a chemically heterogeneous surface, Cassie equation holds as follows:

$$\cos \theta'_c = f \cos \theta_a + (1-f) \cos \theta_b,$$

where f denotes a ratio of area contacting the liquid and solid phases, $\theta_a$ denote a contact angle for component A with a fractional surface area f and $\theta_b$ denote a contact angle for component B with a remaining fractional surface area (1−f). When the liquid contacts the air (e.g., $\theta_b$=180 degrees), the Cassie equation becomes as follows:

$$\cos \theta'_c = f \cos \theta_a + 1 - f.$$

Hence, the contact angle $\theta_c'$ increases even if the interface between the solid and liquid includes the air. When f=1 and the surface returns to homogeneity, the Wenzel's equation holds.

The application of the surface treatment modifies both wetting characteristics of the exposed surfaces in respective strengthening directions. The substrate surface SS with the low wettability (90 degree<$\theta$<180 degrees) becomes more non-wettable ($\theta_w$>0). Simultaneously, the pad surface PS with the high wettability (0<$\theta$<90 degrees) becomes more wettable ($\theta_w$<0). The enhancement of the surface roughness improves solder wettability of the exposed pad surface PS of the pads 114 having high wettability while improving non-wettability of the substrate surface SS having low wettability. Thereby, it is possible to prevent adjacent side connections from bridging when soldering and improve reliability of the side connections as well as chip bonds even if the pitch widths between the side connections and bonds are fine.

Furthermore, in the described embodiment, the surface treatment for enhancing the surface roughness is performed after releasing the interconnection layer part 131 from the support substrate 122. In this embodiment, the surfaces of the pads 140, 141, 142 (including the top surface TS and possibly the edge surface ES of the side connection pad 140) and at least a part of the top surface 130a of the interconnection layer 130 close to the pads 140, 141, 142 can also be subjected to the surface treatment. However, the surface treatment can be applied before releasing the interconnection layer part 131 from the support substrate 122. Furthermore, although the surface treatment for enhancing the surface roughness is preferably applied to both the substrate surface SS and the pad surfaces PS simultaneously, the surface treatment can be applied to the substrate surface SS and the pad surfaces PS separately at possibly different locations.

Figure 4B:
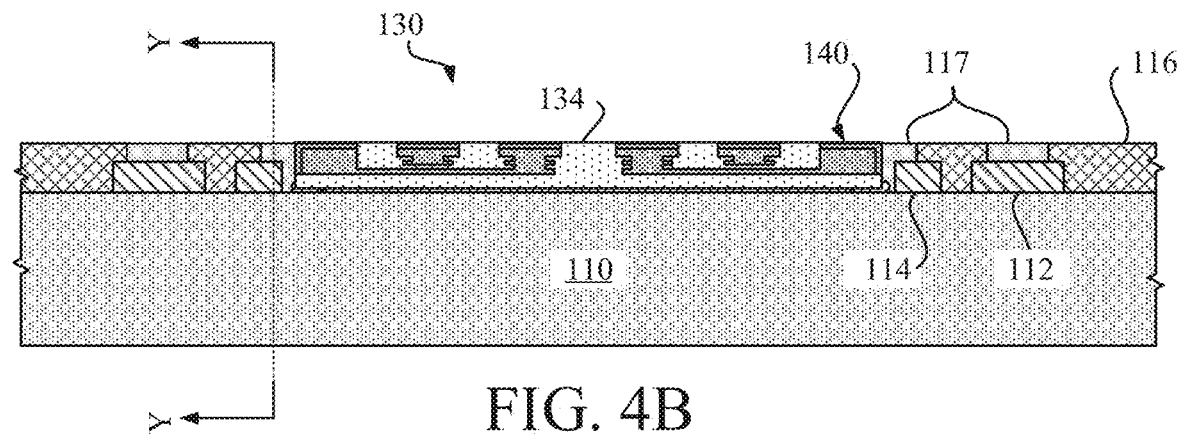
FIG. 4B illustrates cross-sectional views of structures obtained during the fabrication process of the interconnection substrate according to the exemplary embodiment of the present invention.

As shown in FIG. 4B and FIG. 5B, the fabrication process can include a step of applying solder paste 117 onto the pad surfaces PS of the conductive pads 114 and bond pads 112 and the part of the substrate surface SS at least in part to which the surface treatment has been applied. The solder paste 117 can be filled in the opening of the solder resist layer 116. Note that the cross-sectional view shown in FIG. 5B corresponds to a cross-section indicated by "Y" in the cross-sectional view of FIG. 4B.

Figure 4C:
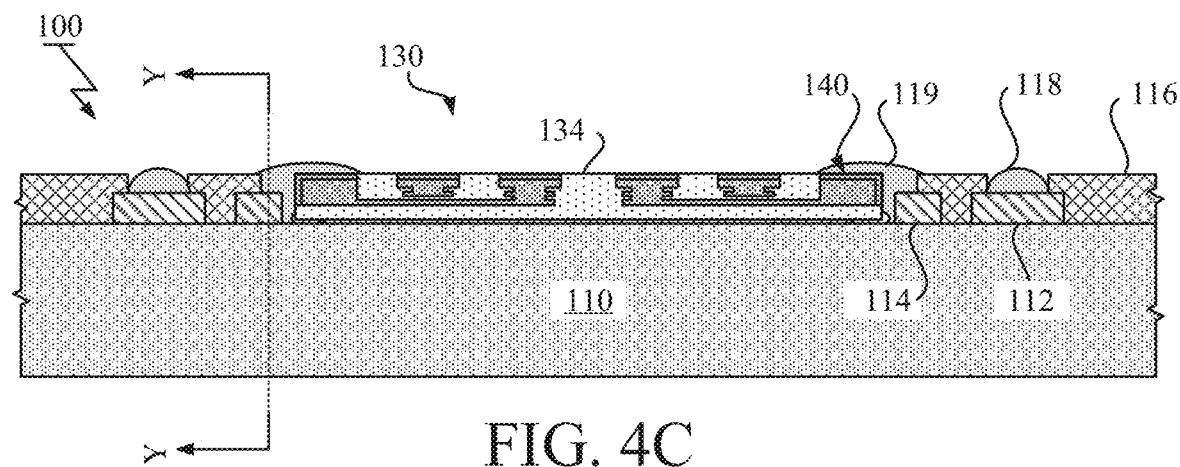
FIG. 4C illustrates cross-sectional views of structures obtained during the fabrication process of the interconnection substrate according to the exemplary embodiment of the present invention.

As shown in FIG. 4C and FIG. 5C, the fabrication process can include a step of heating the solder paste 117 to form the set of the solder joints 119. Note that the cross-sectional view shown in FIG. 5C corresponds to a cross-section indicated by "Y" in the cross-sectional view of FIG. 4C. By heating the solder paste 117, the applied solder paste 117 becomes a molten state to leave from non-wettable substrate surface SS while remaining on the wettable pad surfaces PS separated from each other (as well as the surface of the side connection pads 140) to form the solder joints 119 on the respective conductive pads 114 (as well as the side connection pad 140). The set of solder joints 119 is formed to connect mechanically and electrically the side connection pads 140 of the interconnection layer 130 with the corresponding conductive pads 114 disposed on the organic base substrate 110, respectively. A set of pre-solders 118 can also be formed on the bond pad 114 by this step. The paste can be applied by jet printing, stencil printing or syringe.

In the described embodiment, the step of heating the solder paste 117 to form the set of the solder joints 119 is conducted before the chip mounting. It is suitable for a case where there is a delay until the subsequent chip mounting process is performed. Also in a case where the subsequent chip mounting process does not use a reflow process, the formation of the solder joints 119 is preferably conducted before the chip mounting. However, in a case where the subsequent chip mounting process uses a reflow process, the step of heating the solder paste 117 at this stage can be omitted and the completion of the solder joints 119 can delayed until reflow process of the subsequent chip mounting process.

Although the solder paste is employed as solder material in the described embodiment, however, other solder material can also be contemplated as long as the applied solder material in a liquid or paste state leaves from non-wettable surface while remaining on wettable surfaces separated from each other to form solder joints on the respective wettable surfaces. In alternative embodiment, injection molten soldering (IMS) can be employed to form the solder joints 119. The IMS technology is advantageous when a larger volume of solder is preferable.

Figure 7B:
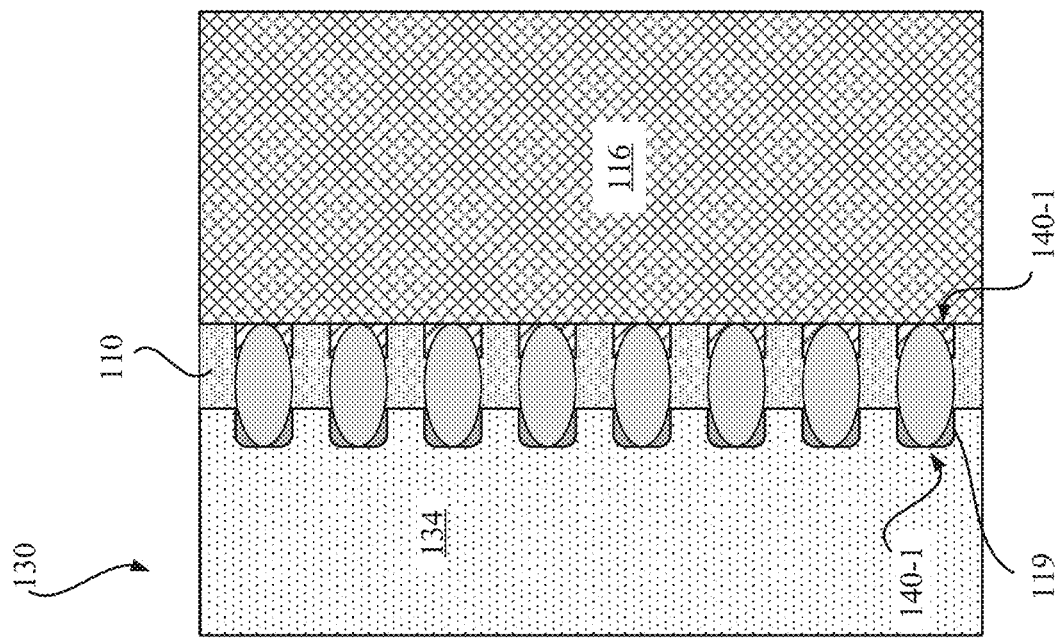
FIG. 7B describes schematics of solder joints expected to be formed on side connection pads and conductive pads without and with the surface treatment of enhancing the surface roughness according to the exemplary embodiment of the present invention, respectively.
Figure 7A:
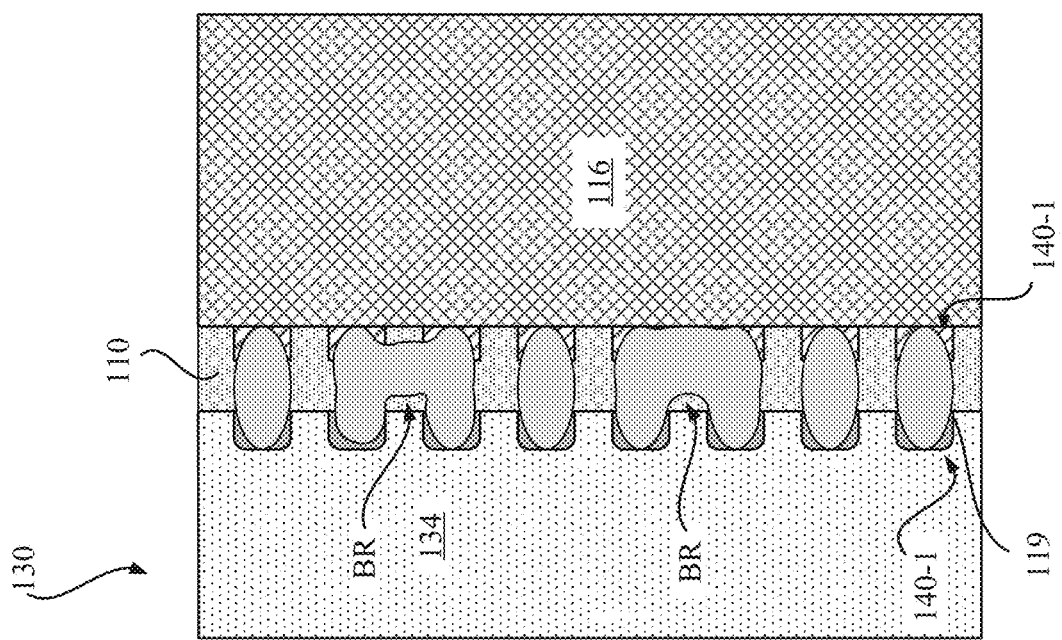
FIG. 7A describes schematics of solder joints expected to be formed on side connection pads and conductive pads without and with the surface treatment of enhancing the surface roughness according to the exemplary embodiment of the present invention, respectively.

FIGS. 7A and 7B describe a schematic of solder joints expected to be formed on the side connection pads 140 and the conductive pads 114 without and with the surface treatment of enhancing the surface roughness. As illustratively shown in FIG. 7A, when the pitch width becomes fine, some adjacent solder joints 119 would form a bridge BR, which causes a short circuit. In contrast, by enhancing the surface roughness on the exposed pad and substrate surfaces PS, SS, even if the pitch width becomes fine, a set of solder joints 119 that are separated from adjacent solder joints can be preferably formed, as illustratively shown in FIG. 7B. The application of the novel surface treatment before solder material application can prevent resultant solder joint 119 from bridging when soldering.

The interconnection substrate 100 obtained by the fabrication process shown in the series of FIGS. 3A-3C, FIGS. 4A-4C and FIGS. 5A-5C (including the organic base substrate 110, the interconnection layer 130 and the set of the solder joints 119) can be passed to a subsequent process such as chip mounting process.

With reference to a series of FIGS. 8A-8F and FIGS. 9A-9B, experimental results of a contact angle of a solder droplet on a buildup substrate in various conditions are described.

Figure 8C:
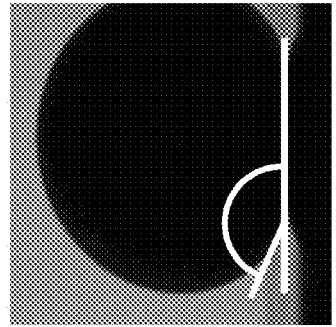
FIG. 8C shows contact angles measured in various conditions.
Figure 8F:
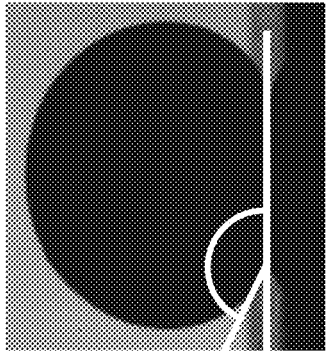
FIG. 8F shows contact angles measured in various conditions.
Figure 8B:
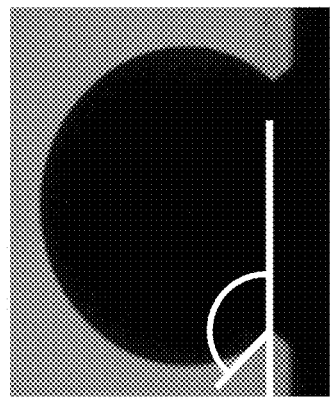
FIG. 8B shows contact angles measured in various conditions.
Figure 8E:
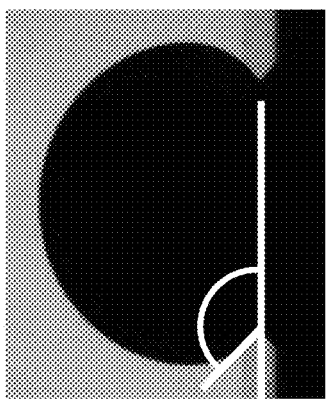
FIG. 8E shows contact angles measured in various conditions.
Figure 8A:
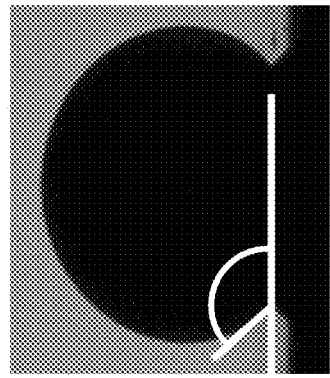
FIG. 8A shows contact angles measured in various conditions.
Figure 8D:
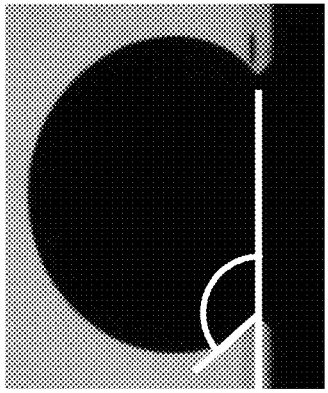
FIG. 8D shows contact angles measured in various conditions.

FIGS. 8A-8F show contact angles of a solder droplet on a buildup substrate that were measured in various conditions. The contact angles of FIGS. 8A-8C were measured under a condition where a stage temperature of 80 degrees Celsius was set whereas the contact angle of FIGS. 8D-8F were measured under a condition where a stage temperature of 250 degrees Celsius was set, which is above the melting point of the lead free solder that was used. FIGS. 8A and 8D correspond to a reference to which no surface treatment was applied. FIGS. 8B and 8E correspond to a case where the buildup substrate was rubbed with sandpaper of 2400-grits. FIGS. 8C and 8F correspond to a case where the buildup substrate was rubbed with sandpaper of 600 grits, which imitate a surface treatment for enhancing surface roughness. Each picture of FIGS. 8A-8F was taken just after dropping of the molten solder onto the stage that had been heated to the predetermined stage temperature.

As shown in FIGS. 8A-8F, by comparing the wettability of three different types of buildup surfaces, it was demonstrated that the rough buildup surface showed lower wettability, especially for the case of the surface rubbed with the sandpaper of 600-grits. The measured values of the three different types of the buildup surfaces are summarized in Table 1.

TABLE 1

| Grit size of the sandpaper | Ref. (smooth) | #2400 | #600 |
|---|---|---|---|
| Contact angle at 80 degrees Celsius | 132 | 136 | 155 |
| Contact angle at 250 degrees Celsius | 134 | 138 | 159 |

Figure 9A:
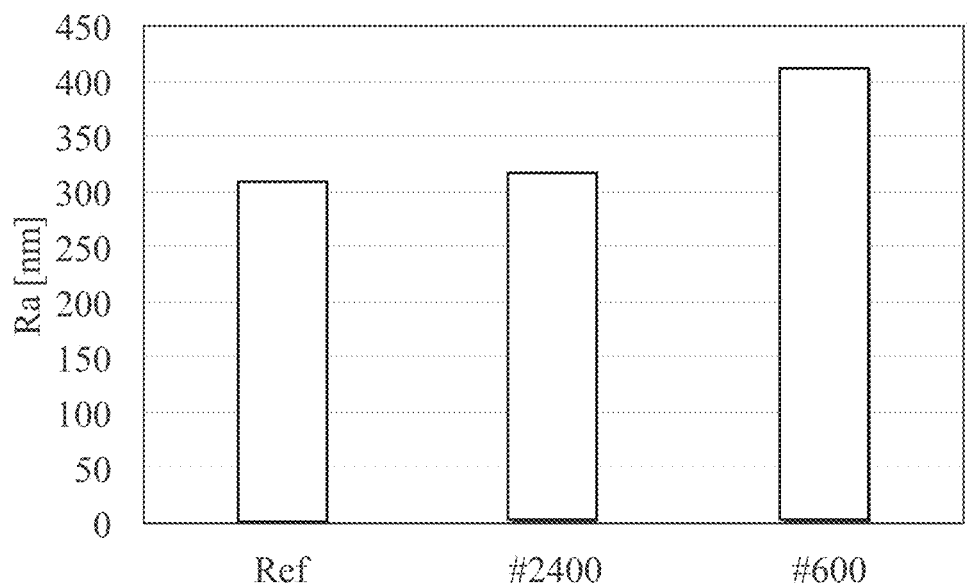
FIG. 9A shows graphs of roughness parameters (Ra, Rq) vs. surface conditions.
Figure 9B:
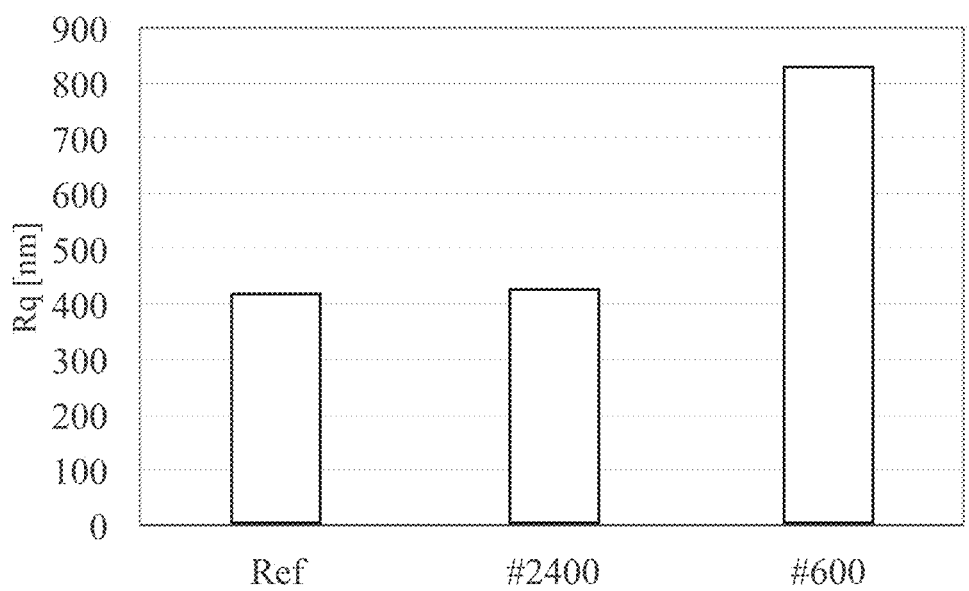
FIG. 9B shows graphs of roughness parameters (Ra, Rq) vs. surface conditions.

FIGS. 9A and 9B show graphs of roughness parameter (Ra, Rq) vs. surface conditions, which includes the reference smooth surface, the surface rubbed with the sandpaper of 2400-grits and the surface rubbed with the sandpaper of 600-grits. The roughness parameter (Ra, Rq) were measured by a light interference microscope. As shown in FIGS. 9A and 9B, Ra and Rq of #600 were the largest. The tendency of Ra and Rq coincided with that of the contact angles shown in FIG. 8A-8F.

With reference to a series of FIGS. 10A-10B and FIGS. 11A-11C, results of computational simulation of solder joint formation on a model structure 1000 are described. Computational fluid dynamic simulation (CFS) was conducted.

Figure 10A:
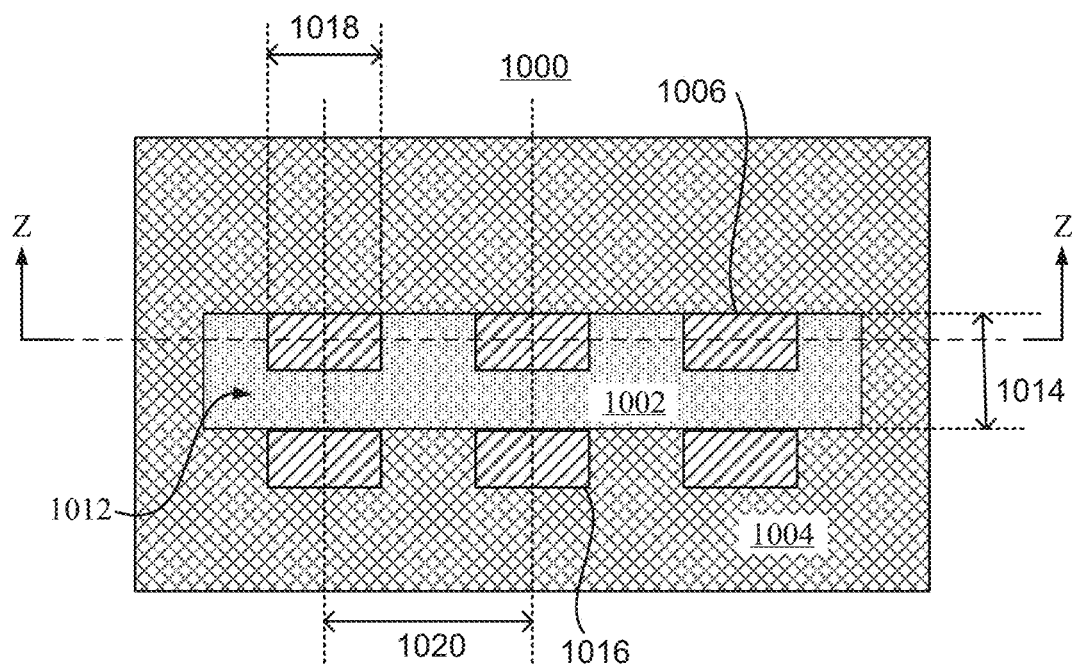
FIG. 10A illustrates a top view and a cross-sectional view of a modeling structure for computational fluid dynamic simulation, respectively.
Figure 10B:
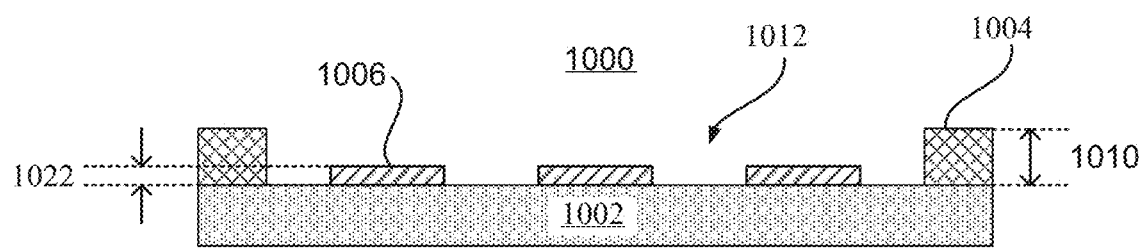
FIG. 10B illustrates a top view and a cross-sectional view of a modeling structure for computational fluid dynamic simulation, respectively.

FIGS. 10A and 10B illustrate a top view and a cross-sectional view of the model structure 1000 used for the computational fluid dynamic simulation, respectively. The model structure 1000 includes a substrate 1002 and a resist 1004 disposed thereon. The resist has a thickness 1010 and has a trench 1012 with a length 1014 that is surrounded by the resist 1004 and has a bottom surface corresponding to a top surface of the substrate 1002. There are three first pads 1006 in the trench 1012 and three second pads 1016 that are placed adjacent to the trench 1012 and are arranged with respect to the first pads 1006. Each pad (1006, 1016) has a width 1018 and arranged with a pitch width 1020. Each first pad 1006 has a height 1022 and is placed on the substrate 1002. The dimensions of the model structure 1000 used for the simulation are as follows: the trench length 1014 is 100 μm; the pad pitch 1020 is 110 μm; the pad width 1018 is 60 μm; the resist thickness 1010, or the trench depth, is 30 μm; and the pad height 1022 is 10 μm.

At the initial state of the simulation, a fluid corresponding to the molten solder is filled in the trench 1012 of the resist 1004. The transient and convergence state are computed in various conditions where the contact angle of the surface of the resin components (the resist 1004 surface and the substrate 1002 surfaces) are set to be 120, 130 and 150 degrees.

Figure 11A:
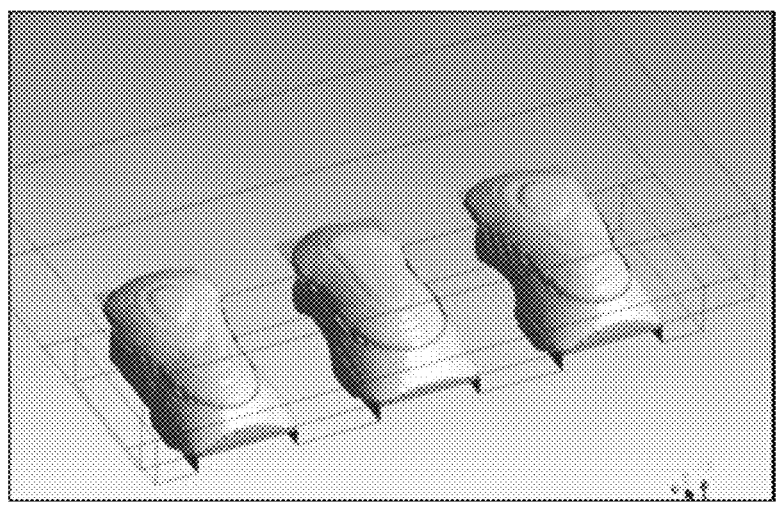
FIG. 11A illustrates simulation results conducted at various contact angles of surfaces of resin components in the modeling structure shown in FIG. 10.
Figure 11B:
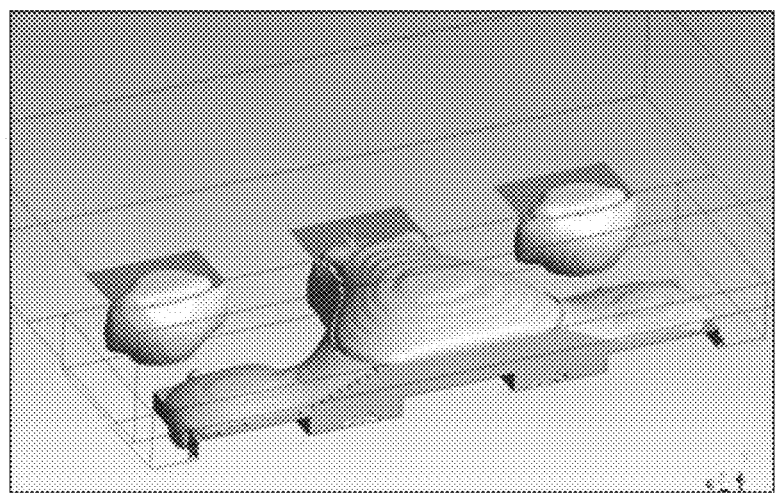
FIG. 11B illustrates simulation results conducted at various contact angles of surfaces of resin components in the modeling structure shown in FIG. 10.
Figure 11C:
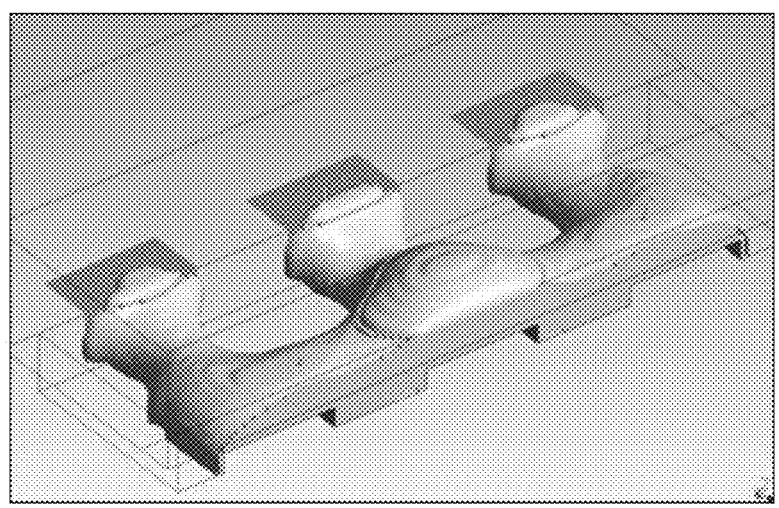
FIG. 11C illustrates simulation results conducted at various contact angles of surfaces of resin components in the modeling structure shown in FIG. 10.

FIGS. 11A-11C illustrate simulation results performed at various contact angles of surfaces of the resin components in the model structure 1000 shown in FIG. 10 at the convergence state.

According to the results of the CFD shown in FIGS. 11A-11C, it is demonstrated that the occurrence of the solder bridging depends highly on the surface condition of the resin components of the substrate 1002. The solder bridging tends to occur as the contact angle of the resin components decreases. In other words, worsening the wettability of the resin surface contribute to prevent the solder joints across the adjacent pads from bridging. Also as can be inferred from the simulation results of the contact angle of the resin component of the substrate 1002, it is expected that the solder bridging tends to be prevented as the contact angle of the pad material decreases.

Hereinafter, referring to FIG. 12, a schematic of a connection structure after chip mounting according to the exemplary embodiment of the present invention is described.

Figure 12:
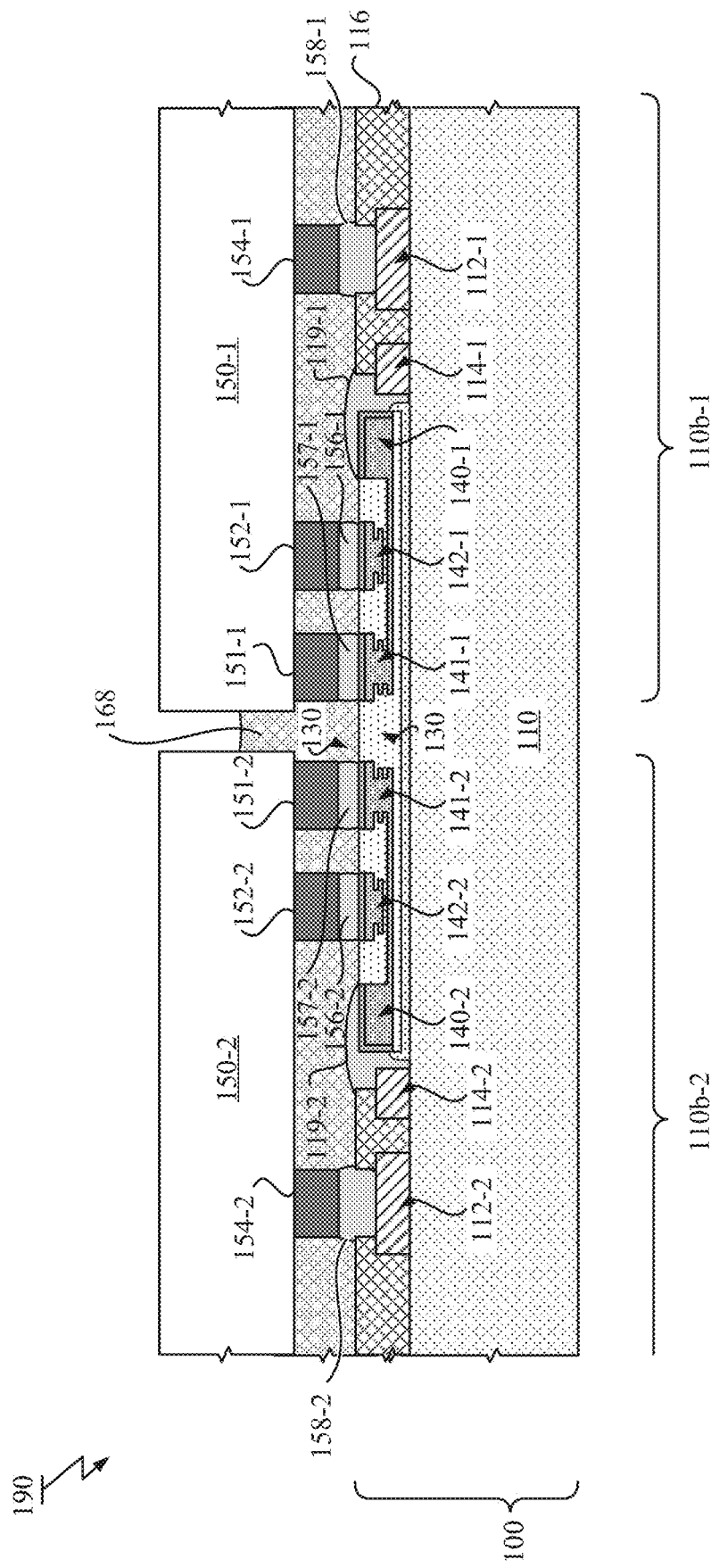
FIG. 12 illustrates a cross-sectional view of an electronic device around the interconnection layer according to an exemplary embodiment of the present invention.

FIG. 12 illustrates a schematic of an electronic device 190 that includes an interconnection substrate 100 as an interposer. FIG. 12 shows an enlarged cross-sectional view of the electronic device 190 around the interconnection layer 130. As shown in FIG. 12, there are two chips 150-1 and 150-2 mounted on the interconnection substrate 100 as electronic components. Examples of the chip can include a CPU (Central Processing Unit), a GPU (Graphical Processing Unit), a SoC (System on a Chip), a memory device such as a HBM (High Bandwidth Memory), etc. The first chip 150-1 and the adjacent second chip 150-2 can be configured to perform signal transmission with each other through the interconnection layer 130 that is located between the first and second chips 150-1, 150-2. In the described embodiment, the chips 150 are connected to a power supply or ground line of the organic base substrate 110, which works as signal return current path, through the writing in the interconnection layer 130.

As shown in FIG. 12, the electronic device 190 includes the aforementioned interconnection substrate 100; and the first and second chips 150-1, 150-2 mounted on the interconnection substrate 100 with its active surface being faced down. Each chip 150 can be located at a position corresponding to the flip-chip area 110b on the interconnection substrate 100. The gap between the interconnection substrate 100 and the chip 150 can be filled by an underfill 168, which can be made of epoxies or urethanes.

The first group of the bond pads 112-1 and the first set of the bond pads 141-1, 142-1 are positioned within the first flip-chip area 110b-1 where the first chip 150-1 is mounted. The first chip 150-1 has a set of terminal bumps 151-1, 152-1 electrically connected to the first set of the pads 141-1, 142-1 of the interconnection layer 130 through solders 156-1, 157-1. The first chip 150-1 has also a set of other terminals 154-1 electrically connected to the first group of the bond pads 112-1 on the organic base substrate 110 through a solder 158-1. The terminal bumps 151-1, 152-1, 154-1 can be, but not limited to, Cu pillar type bumps. The terminal bumps 151-1 can be a power supply or ground terminal that is configured to connect with the power supply or ground line that can work as a signal return current path. More specifically, the terminal bumps 151 is connected to the bond pad 141 that is connected, via wiring embedded in the organic insulation material 134, to the corresponding side connection pad 140 that is further connected to the power supply line or the ground line of the organic base substrate 110 through the solder joint 119. The same applies to the second flip-chip area 110b-2 and the second chip 150-2.

Although not shown in FIG. 12, the interconnection substrate 100 on which the a plurality of the chips 150 are mounted constitutes an electronic package, which can have bumps formed at the bottom of the interconnection substrate 100 and is further mounted on a mother board through package interconnections between the bumps of the interconnection substrate 100 and pads formed on the mother board. The final assembly product including the interconnection substrate 100, the chips 150 and the mother board can also be one of the electronic devices and is also a connection structure after the chip mounting.

The plurality of chips 150 can communicate with each other through the interconnection layer 130 while the chips 150 are connected to the mother board through the internal structure of the organic base substrate 110. Further according to the described embodiment, the power supply lines and the ground lines to the chips 150 can be routed through the interconnection layer 130 by way of the side connections achieved by the solder joint 119. It permits suppression of voltage drops in comparison with a case where routing of the wiring on the organic base substrate is conducted while avoiding an area of the interconnection layer. Provision of a power supply or ground line that works as a signal return current path by using the interconnection layer is advantageous for high-speed signal transmission.

The interconnection structure can include a novel side connection between the conductive pad 114 of the organic base substrate 110 and the side connection pad 140 of the interconnection layer 130. Introduction of the novel side connection improves flexibility for routing of wiring with the interconnection layer 130. Also, it relaxes constraints on a terminal layout of the chip 150 that uses the interconnection layer 130. Such interconnection structure is suitable for heterogeneous integration.

Although FIG. 12 shows merely two chips and one interconnection layer 130 through which the two chips communicate. However, the number of chips, the number of chips per one interconnection layer and the number of the interconnection layers in the electronic device is not limited.

Figure 13A:
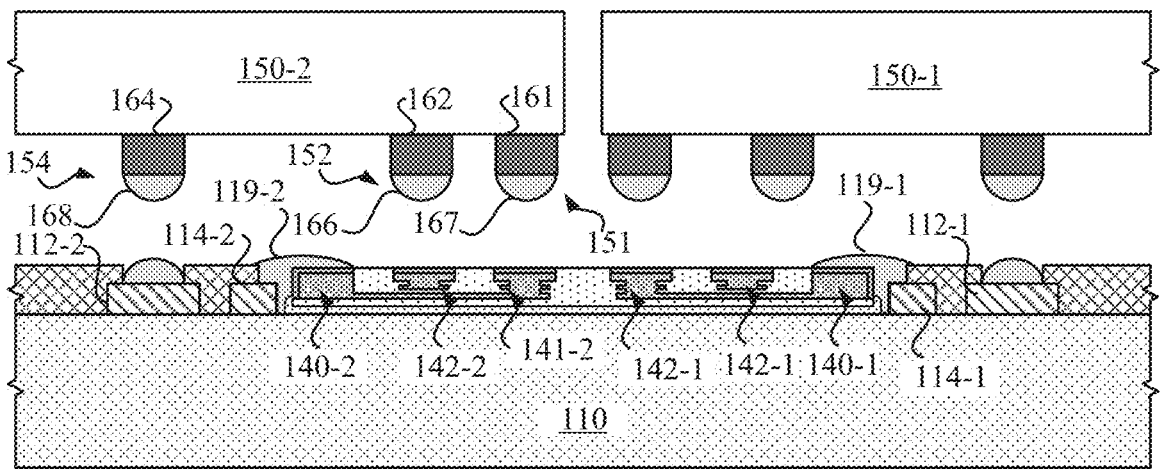
FIG. 13A illustrates cross-sectional views of structures obtained during a fabrication process of an electronic device according to the exemplary embodiment of the present invention.
Figure 13B:
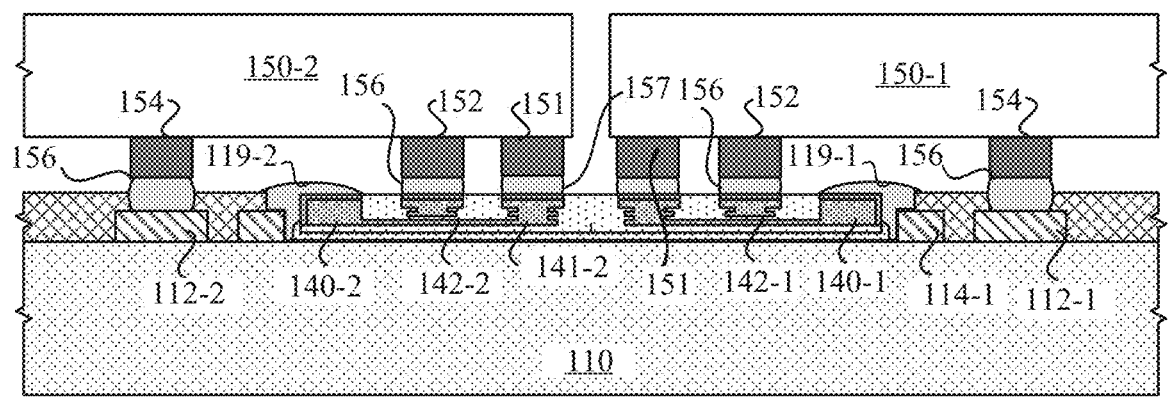
FIG. 13B illustrates cross-sectional views of structures obtained during a fabrication process of an electronic device according to the exemplary embodiment of the present invention.
Figure 13C:
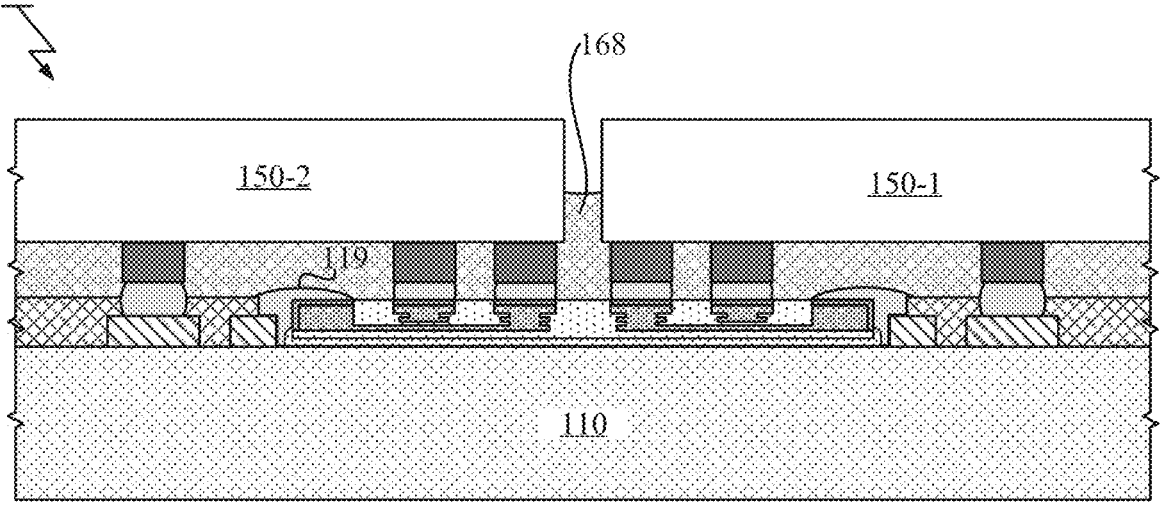
FIG. 13C illustrates cross-sectional views of structures obtained during a fabrication process of an electronic device according to the exemplary embodiment of the present invention.

Referring to FIGS. 13A-13C, a fabrication process of the electronic device that is subsequently performed after the fabrication process of the interconnection substrate according to the exemplary embodiment of the present invention. FIGS. 13A-13C illustrate cross-sectional views of structures obtained during the fabrication process of the electronic device 190.

As shown in FIG. 13A, the fabrication process of the electronic device can include a step of mounting a plurality of chips 150 onto the interconnection substrate 100 with it active surface being faced down. The first chip 150-1 can be located at a position where the first group of the bond pads 112 and the first set of the pads 141-1, 141-2 of the interconnection layer 130 locate. The same applies to the second chip 150-2.

The chips 150 prepared for this step can include terminal bumps 151, 152, 154, each of which can be made up of a pillar 161, 162, or 164 and a solder cap 166, 167, or 168 formed thereon. In the described embodiment, the terminal bumps 151, 152, 154 are Cu pillar bumps. However, in other embodiment, the terminal bumps 151, 152, 154 can be any one of standard bumps including standard flip-chip bump, fine-pitch, micro-bump, Cu pillar bump, Cu post bump with Sn a cap (SLID), etc. In the described embodiment, there is no solder on the bond pads 141, 142 of the interconnection substrate 100 prepared for this step since each bond pad 141, 142 has the barrier metal layer 138 on the top, which improves wettability. However, applying solder onto the bond pads 141, 142 before chip mounting is not hindered.

As shown in FIG. 13B, the fabrication process can include a step of forming solder interconnection 156, 157, 158 between the bond pads 112, 141, 142 and the pillars 161, 162, 164 by solder reflow process.

By performing the steps shown in FIGS. 13A and 13B, the chips 150 are mounted on the interconnection substrate 100 such that the chips 150 has terminal bumps 151 that are bonded to the bond pads 141 and are electrically connected to the conductive pads 114 disposed on the organic base substrate 110 through the side connection pads 140 by the solder joints 119.

As shown in FIG. 13C, the fabrication process can include a step of dispensing a underfill 168 to fill a gap between the interconnection substrate 100 and the chips 150 by capillary flow underfill process, followed by curing so as to fix the first chip 150-1 and the second chip 150-2 to the interconnection substrate 100.

In the described embodiment, the underfill 168 is described as being applied onto the organic base substrate 110 after it has been subjected to the reflow treatment. However, in other embodiment, no-flow underfill can be dispensed on the interconnection substrate 100 at first. Then, the chips 150 are placed on the interconnection substrate 100 where the underfill has been dispensed. Finally, forming of the solder interconnections 156, 157, 158 and curing of the underfill are performed by a reflow treatment, simultaneously. In the described embodiment, solder reflow process is used as bonding process. However, in other embodiment, thermal compression (TC) bonding process can also be contemplated instead of the solder reflow process.

The connection structure according to one or more embodiments of the present invention can prevent solder joints formed on adjacent pads from bridging when soldering. The application of the surface treatment of enhancing the surface roughness improves the wettability of the pad surfaces of the pads and the de-wettability of the top surface of the substrate with respect to the molten solder. Thereby, it is possible to improve reliability of solder joints even if pitches between the solder joints become fine. Furthermore, it is possible to reduce production cost and to improve production yield of the connection structure and accordingly electronic devices including the connection structure.

Although the target of the novel surface treatment is the solder joints for the side connection and/or the solder joints for flip chip bonding in the aforementioned embodiment, however, the target of the novel surface treatment is not limited. Other solder joints such as BGA (Ball Grid Array), QFP (Quad Flat Package), solder joints for wire bonding to a chip and solder joints for other surface mount device are also contemplated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a connection structure, comprising:
   providing a substrate having a top surface and including a set of pads for soldering, each having a pad surface exposed from the top surface of the substrate; and
   applying a surface treatment to at least a part of the top surface of the substrate close to the pads and the pad surface of each pad of the set of pads so as to make at least the part of the top surface and the pad surfaces of the pads rougher.

2. The method of claim 1, wherein the top surface of the substrate has low wettability and the pad surface of each pad has high wettability for molten solder.

3. The method of claim 1, wherein at least the part of the top surface of the substrate after application of the surface treatment has a roughness parameter (Ra) greater than 0.4 µm and lower than 2 µm.

4. The method of claim 1, wherein the pad comprises metal material, and at least the part of the top surface adjacent to the pad includes organic material.

5. The method of claim 4, the part comprising the organic material is provided by a member selected from a group consisting of an organic substrate, a dielectric layer disposed on the substrate, a solder resist layer disposed on the substrate, an adhesive disposed on the substrate and combination thereof.

6. The method of claim 1, wherein the surface treatment includes sandblasting.

7. The method of claim 6, wherein the sandblasting includes wet blasting.

8. The method of claim 1, wherein the surface treatment includes a plasma treatment.

9. The method of claim 8, wherein the plasma treatment includes Argon plasma.

10. The method of claim 1, further comprising forming a set of solder joints each disposed on a corresponding one of the pads.

11. The method of claim 10, wherein forming of the set of the solder joints includes:
    applying solder material onto the pad surfaces of the set of pads and the part of the top surface of the substrate at least in part to which the surface treatment has been applied; and
    heating the solder material to form the set of the solder joints.

12. The method of claim 1, wherein the substrate further includes an interconnection layer disposed on the substrate, the interconnection layer having an edge located next to the set of pads and including a set of side connection pads located and exposed at the edge of the interconnection layer, each side connection pad being arranged with respect to a corresponding one of the pads disposed on the substrate.

13. The method of claim 12, wherein each side connection pad has a top surface exposed at a top surface of the interconnection layer and an edge surface exposed at the edge of the interconnection layer, the edge surface facing toward the corresponding one of the set of pads.

14. The method of claim 12, further comprising forming a set of solder joints to connect the side connection pads of the interconnection layer with the pads disposed on the substrate, respectively.

* * * * *